United States Patent [19]

Sakata

[11] Patent Number: 5,388,159

[45] Date of Patent: Feb. 7, 1995

[54] EQUALIZING CIRCUIT FOR REPRODUCED SIGNALS

[75] Inventor: Haruo Sakata, Tokyo, Japan

[73] Assignee: Clarion Co., Ltd., Tokyo, Japan

[21] Appl. No.: 993,389

[22] Filed: Dec. 18, 1992

[30] Foreign Application Priority Data

Dec. 20, 1991 [JP] Japan ................... 3-355210
Jan. 10, 1992 [JP] Japan ................... 4-022026
Feb. 24, 1992 [JP] Japan ................... 4-072781
Mar. 13, 1992 [JP] Japan ................... 4-089895
Oct. 21, 1992 [JP] Japan ................... 4-308297

[51] Int. Cl.$^6$ ............................ H03G 3/00
[52] U.S. Cl. ...................... 381/61; 381/98; 348/625
[58] Field of Search ............ 358/166, 168, 169; 381/61, 98, 118

[56] References Cited

U.S. PATENT DOCUMENTS 3,681,618 8/1972 Blackmer .
4,316,060 2/1982 Adams et al. ............... 381/98
4,620,226 10/1986 Cheung ..................... 358/143
4,991,226 2/1991 Bongiorno ................. 455/200.1

FOREIGN PATENT DOCUMENTS 59-105707 6/1984 Japan ..................... 381/61

OTHER PUBLICATIONS

Sedra & Smith, *Microelectronic Circuits*, 1987, pp. 67 & 68, HRW.

Primary Examiner—Curtis Kuntz
Assistant Examiner—Mark Kelly
Attorney, Agent, or Firm—Flynn, Thiel, Boutell & Tanis

[57] ABSTRACT

An equalizing circuit is disclosed, in which a received signal is divided into high frequency components in different bands and a low frequency component; after having subjected the high frequency components to a predetermined signal processing, they are amplitude-modulated, based on amplitudes thereof; and amplitude modulated signals thus obtained and the low frequency component are combined to obtain a synthesized signal. By effecting such a equalizing processing, it is possible to make the reproduced image quality of a video signal more distinct and to make an audio signal, whose band is restricted, have richer sound quality.

7 Claims, 26 Drawing Sheets

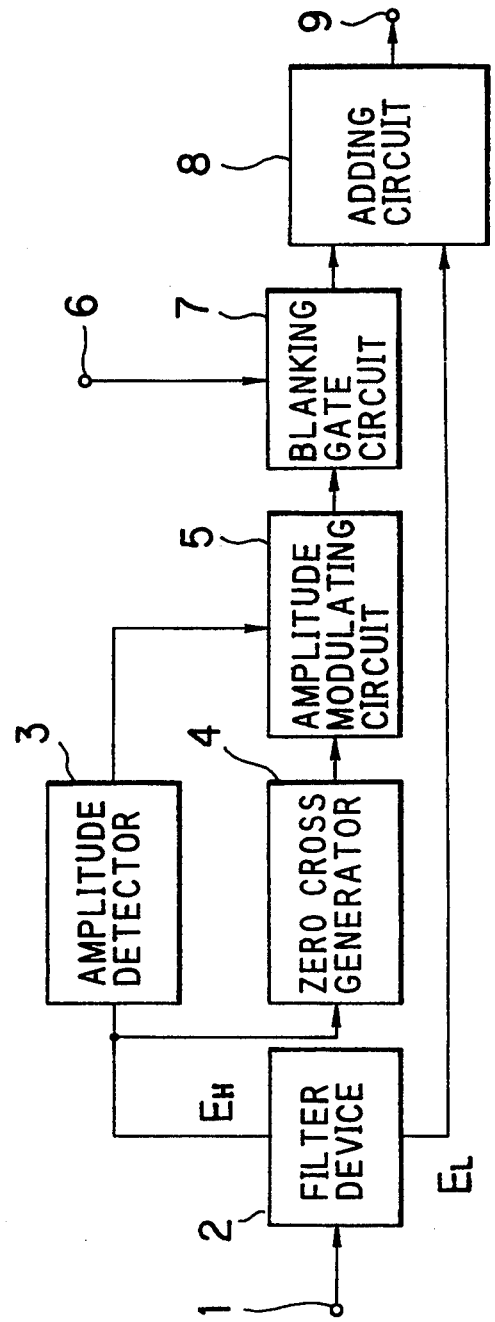

X →     X →

0 ———————
 x →

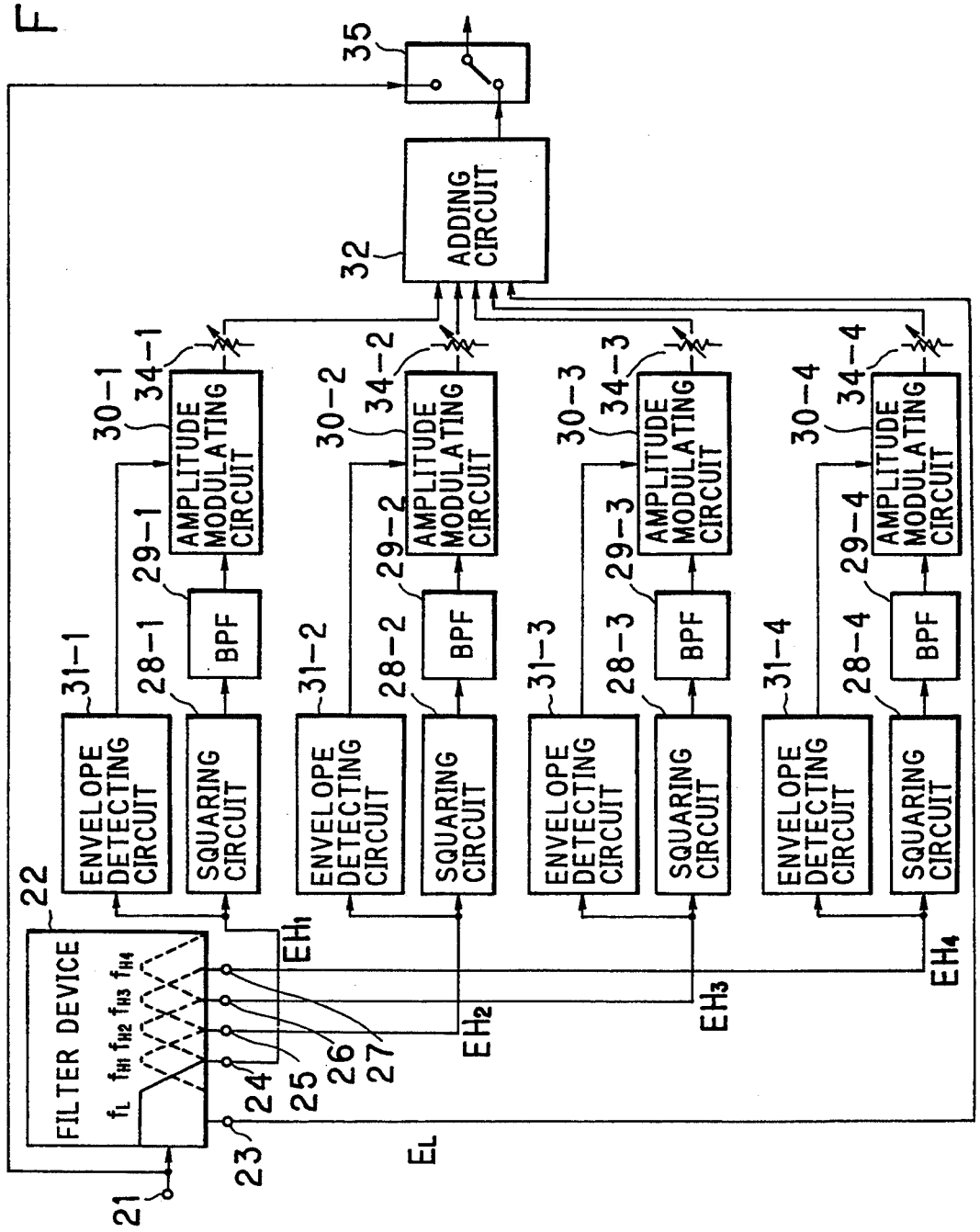

$f_A < f_C$ $f_A > f_C$ $f_A \leq f_C$

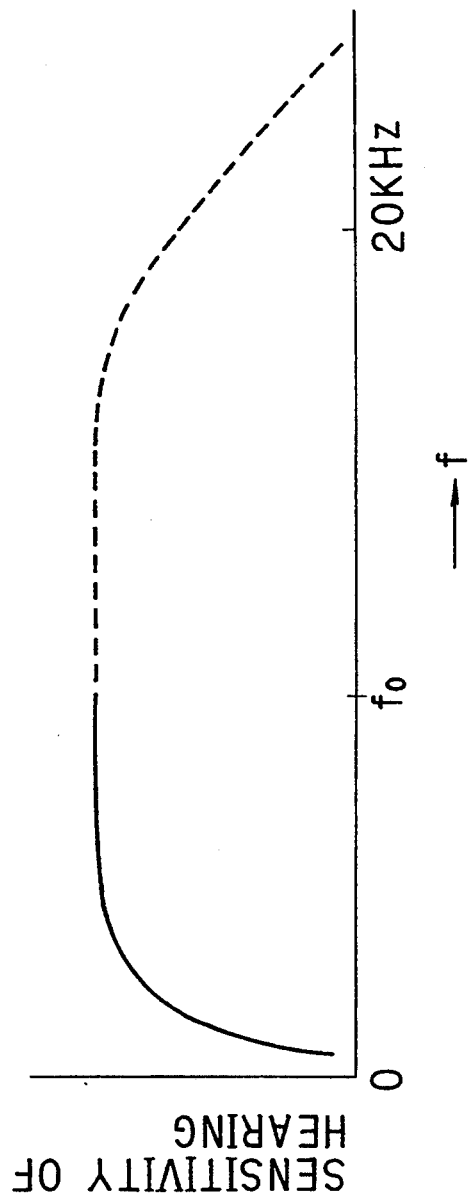

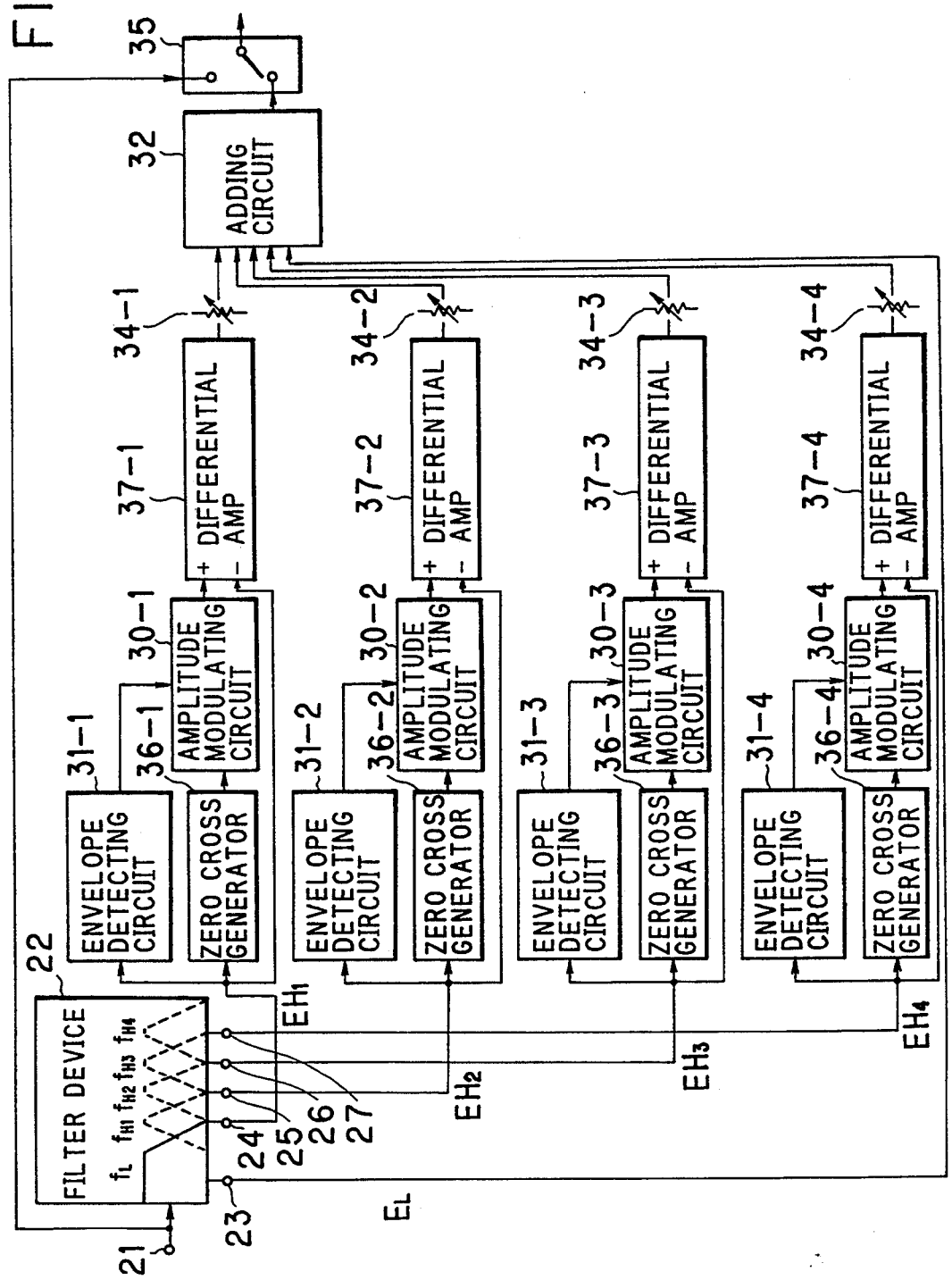

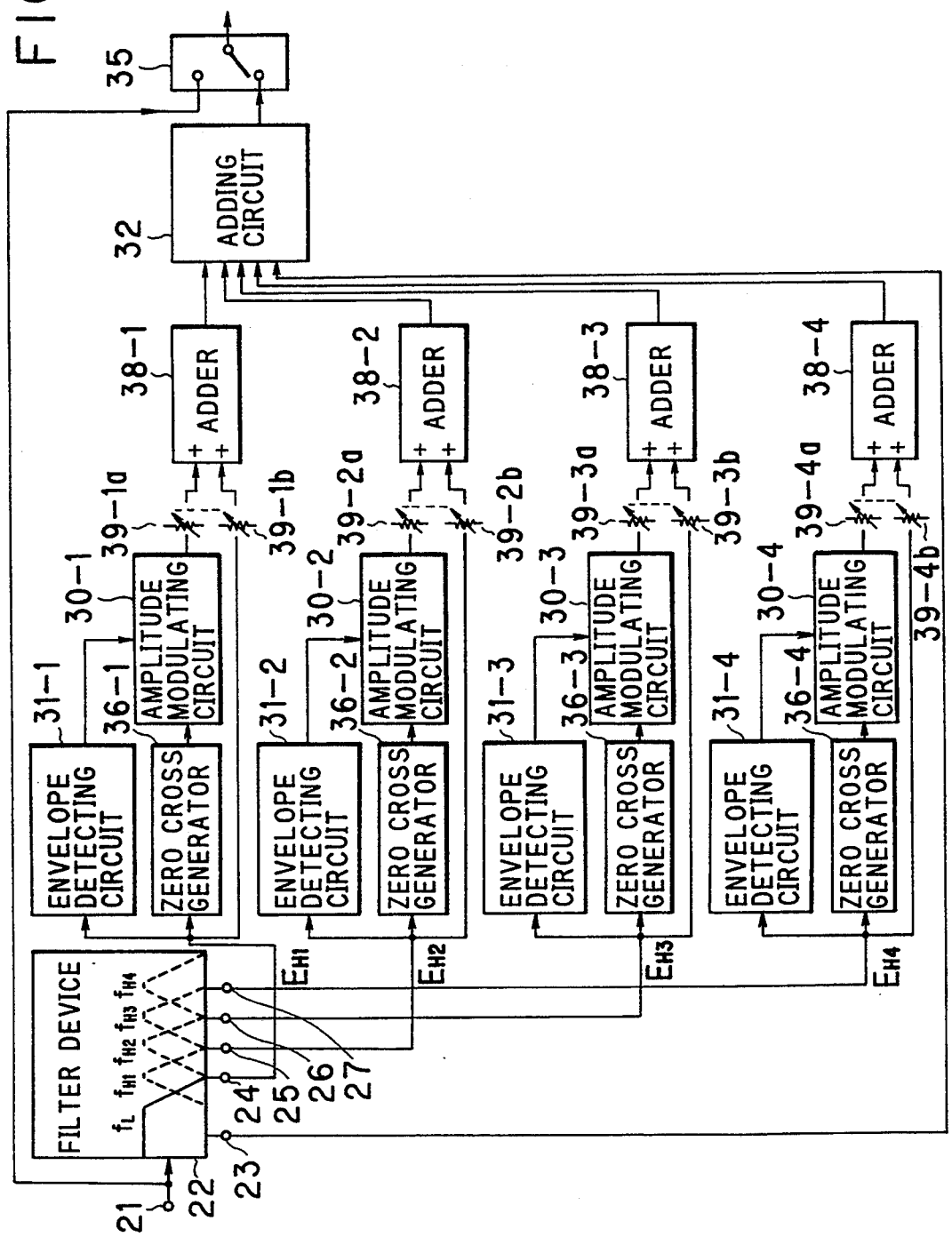

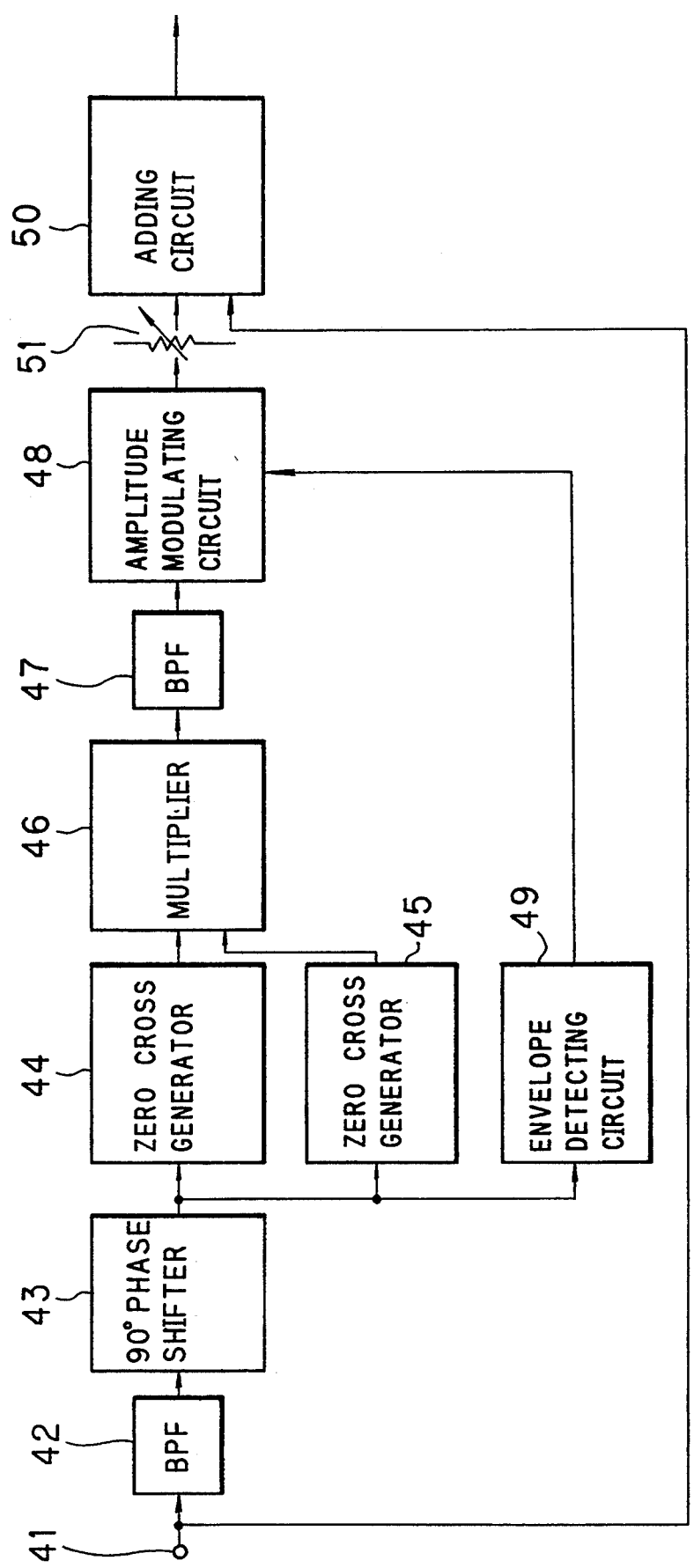

EQUALIZING CIRCUIT FOR REPRODUCED SIGNALS

FIELD OF THE INVENTION

The present invention relates to an equalizing circuit for reproduced signals such as video signals, audio signals, etc. and in particular to a construction thereof for making reproduced images more distinct or for enriching sound quality of audio signals on auditory feeling by subjecting high frequency components of video or audio signals restricted in the band to predetermined equalizing processing.

BACKGROUND OF THE INVENTION

In conventional TV transmitting and receiving systems there are many cases where image signals are transmitted in a restricted band. For example, in the NTSC system used for the broadcast, the bands are 4.2 MHz for the brightness signal $E_Y$, 1.5 MHz for the color difference signal $E_I$, and 0.5 MHz for $E_Q$.

Taking the brightness signal as an example, rectangular wave signals in the neighborhood of $f=1$ MHz and 2 MHz in the transmission band of $0 \sim 4.2$ MHz indicated by (a) in FIG. 4 (corresponding to clear and dark stripes in an original image) are displayed as follows. Rectangular wave signals indicated by (b) are transformed into those indicated by (c) in the same figure by the band restriction. In particular, for $f=2$ MHz, only the sinusoidal wave, which is the fundamental wave, is displayed as the brightness signal in the reproduced pattern.

As described above, for the rectangular wave (stripe pattern), which is the fundamental wave of the brightness signal at $f=2$ MHz, heretofore only the sinusoidal wave, which is the fundamental wave, is displayed, as indicated by (c) in FIG. 4. Due to this fact, sharpness of the pattern is lost. Further the band for $E_Q$ is 0.5 MHz and since for the rectangular wave at 0.2 MHz only the fundamental wave is displayed, image quality is worsened.

On the other hand, for transmission recording of audio signals there are bands suitable therefor. For example, suitable transmission bands are 0 to 15 kHz for the FM broadcast and 0 to 20 kHz for CD. Designating the upper limit frequency of these transmission band by $f_C$, this can be considered as a kind of low pass filters (LPF), whose cutoff frequency is $f_C$. In the case where the frequency of a sound source is below $f_C$ as indicated by (a) in FIG. 11, there is no problem, even if the transmission is effected through the low pass filter (LPF) described above, because it is recorded or transmitted as it is.

However, in the case where the sound source has components over $f_C$, as indicated by (b) in FIG. 11, it is transmitted or recorded without the components over $f_C$, which are removed by the low pass filter (LPF) described above, as indicated by (c) in FIG. 11. Therefore, of course, the components over $f_C$ are not reproduced and thus sound different from the original is reproduced.

When sound sensing techniques become excellent and performance of reproducing apparatuses is improved, as they are recently, if components over 15 kHz for FM and over 20 kHz for CD are removed, worsening in sound quality may be felt. In general, it is said that the audible sound region is 20 Hz to 20 kHz, but sensitivity is not zero at 20 kHz.

Heretofore the reproduction of audio signals was aimed under the restriction in the band by the transmission system described above. However, when the original sound source has a frequency distribution $f_A$ as indicated by (b) in FIG. 11, since the transmitting system or the recording system is restricted in the transmission band as described above, audio signals pass through a low pass filter, whose cutoff frequency is $f_C$, and the signals of $f_A > f_C$ are removed. As the result, even if they are reproduced by a reproducing system with a high fidelity, the components of $f_A > f_C$ cannot be reproduced. This gives rise to a problem from the point of view of a high fidelity reproduction.

That is, since the band of $f_A > f_C$ thus removed includes frequency components giving rise to rich high frequency sounds, if these components are cut by a transmitting system equivalent to an LPF, as they were heretofore, there is a problem that high fidelity reproduction of the original sound is impossible and sound quality is worsened.

OBJECT OF THE INVENTION

A first object of the present invention is therefore to provide a video signal equalizing circuit for making the contour sharp, which is made indistinct by the band restriction, when video signals are reproduced through a transmitting system, whose band is restricted.

A second object of the present invention is to provide an audio signal equalizing circuit by disposing a mode function capable of adding high frequency components in the audible frequency region, which are removed by a transmitting system at reproducing audio signals restricted in the band, and by making this mode function act at need so as to obtain rich reproduced sound.

SUMMARY OF THE INVENTION

In order to achieve the above first object, the present invention proposes a reproduced signal equalizing circuit comprising filter means, which divides a reproduced signal into a first component signal and a second component signal having different bands to output them; detecting means for detecting an amplitude of said second component signal to output an amplitude detection signal; signal processing means for subjecting said second component signal to predetermined signal processing to obtain a signal to be modulated; amplitude modulating means for amplitude-modulating said signal to be modulated, based on said amplitude detection signal to output an amplitude modulated signal; and synthesizing means for combining said amplitude modulated signal with said first component signal to output a synthesized signal.

On the other hand, in order to achieve the above second object, the present invention proposes a reproduced signal equalizing circuit comprising filter means, which divides a reproduced signal into a first component signal and second to n-th component signals having different bands to output them; a plurality of detecting means for detecting amplitudes of said second to n-th component signals to output amplitude detection signals, respectively; a plurality of signal processing means for subjecting said second to n-th component signals to predetermined signal processing to obtain signals to be modulated, respectively; a plurality of amplitude modulating means for amplitude-modulating said signals to be modulated, based on said amplitude detection signals to output amplitude modulated signals, respectively; and synthesizing means for combining said amplitude modulated signals and said first component signal all together to output a synthesized signal.

BRIEF DESCRIPTION OF THE DRAWINGS

FIG. 1 is a block diagram showing an embodiment of the present invention;

FIG. 10 is a block diagram showing still another embodiment of the present invention;

FIG. 13 is a curve for explaining frequency characteristics of the hearing sense;

FIG. 14 is a block diagram showing still another embodiment of the present invention;

FIG. 16 is a block diagram showing still another embodiment of the present invention;

FIG. 18 is a block diagram showing still another embodiment of the present invention;

FIG. 28 shows waveforms for explaining the operation of the embodiment indicated in FIG. 27.

DETAILED DESCRIPTION

Figure 2A:
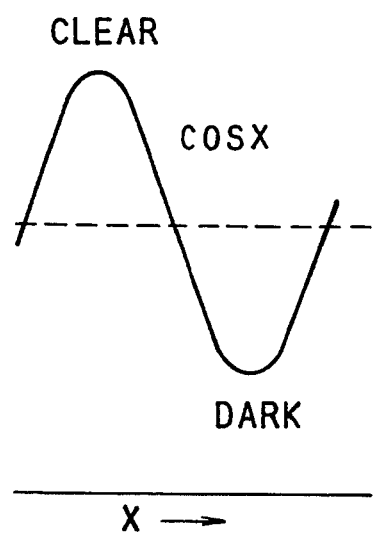
FIG. 2 shows waveforms indicating how spatial sinusoidal waves are seen by the visual sense.

Hereinbelow some embodiments of the invention indicated in the drawings will be explained.

Figure 2B:
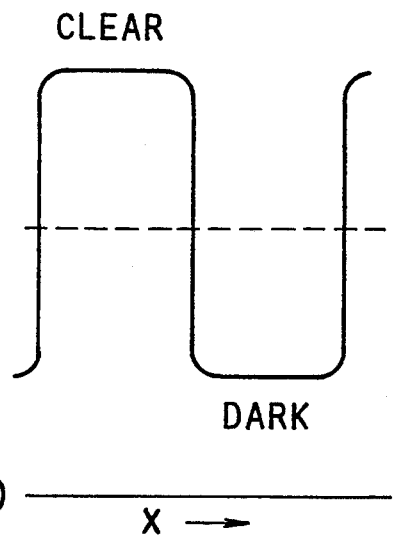
Figure 3:
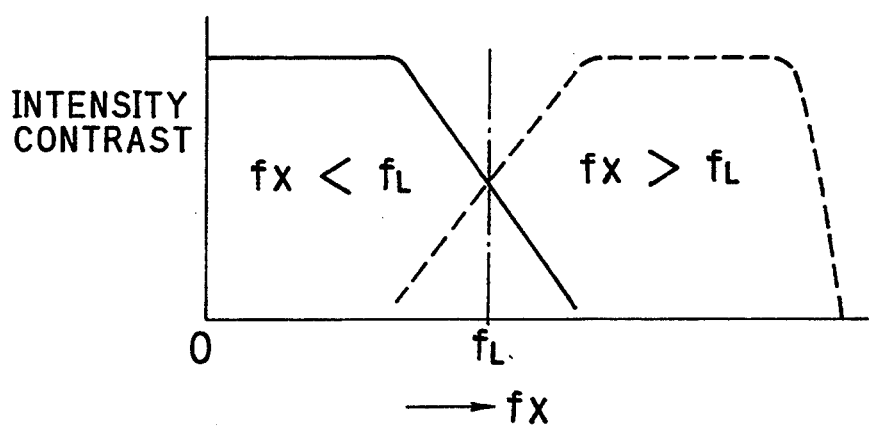
FIG. 3 is a characteristic diagram indicating an expected relation between the spatial frequency and the brightness contrast.
Figure 5:
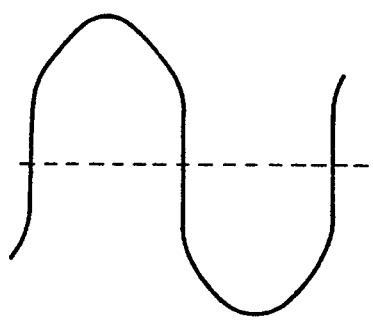
FIG. 5 shows a waveform, in which the zero cross of a sinusoidal wave is emphasized.

FIG. 2 shows how spatial sinusoidal pattern are viewed by the visual sense. It is known that patterns, for which brightness varies according to cosx as indicated by (a) in the figure, are seen also as if they were rectangular waves, if the spatial frequency increases. That is, if the spatial frequency is high, the visual sense acts so that a sinusoidal wave pattern and a rectangular wave pattern are seen without feeling of disorder, even if they are brought close to each other. From the standpoint on characteristics of the visual sense, in order to make images distinct in a high frequency region, where the resolving power is lowered, it is better that selecting a spatial frequency $f_L$ as a border as indicated in FIG. 3, the sinusoidal wave is displayed as it is for $f_x<f_L$ and it is transformed into a rectangular wave (zero cross waveform of the sinusoidal wave) for $f_x>f_L$. In this way a form, by which characteristics of the visual sense are emphasized, is obtained. For example, $f_X=f_L$ (cos $\omega_L x$) gives a waveform, by which zero crosses of a sinusoidal wave are emphasized, as indicated in FIG. 5.

FIG. 1 shows an embodiment of the video signal equalizing circuit according to the present invention, based on the principle described above, in which reference numeral 1 is a video signal; 2 is a filter device; 3 is an amplitude detector; 4 is a zero cross generator; 5 is an amplitude modulating circuit; 6 is a blanking (BLK) signal; 7 is a blanking gate circuit; 8 is an adding circuit; and 9 is an output signal.

The band of the video signal 1 is restricted by $f_C$ (in the broadcast $f_C=4.2$ MHz) and divided into a low frequency component signal $E_L$ and a high frequency component signal $E_H$ by the filter device 2.

Figure 4A:
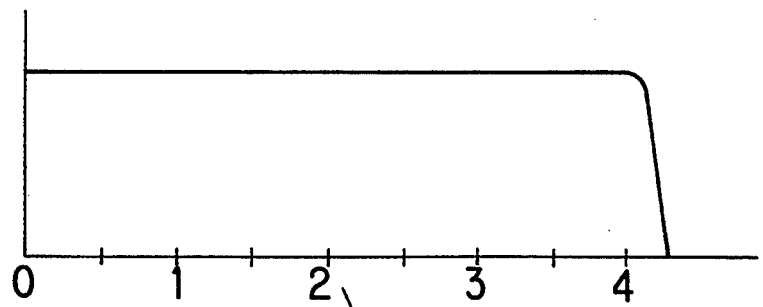
FIG. 4 is a diagram for explaining a reproducing power of a television system.
Figure 4B:
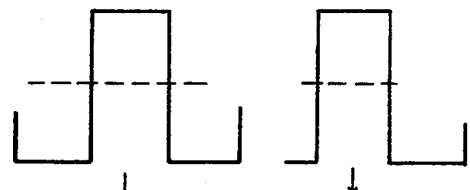
Figure 4C:
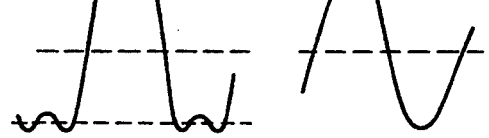
Figure 6:
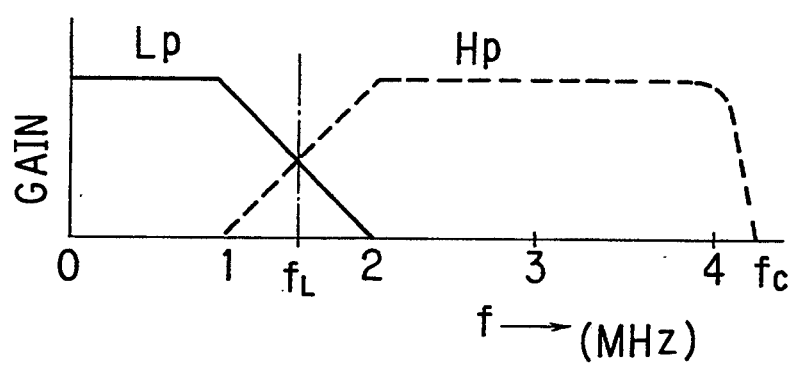
FIG. 6 is a characteristic diagram indicating an example of characteristics of a filter device.

FIG. 6 shows an example of characteristics of the filter device 2. In the characteristics indicated in FIG. 6 tails of the low frequency region $L_P$ and the high frequency region $H_P$, the border between which is at $f_L$, vary slowly and further in a region of $f=1$ to 2 MHz $E_H$ and $E_L$ coexist. These limits 1 MHz and 2 MHz of this region are not strict. Since $f_C=4.2$ MHz, as explained for FIG. 4, it is desirable that the frequency, at which the gain of the filter device 2 indicated in FIG. 6 in the low frequency region $L_P$ begins to decrease, is below $f_C/3$ ($=1.4$ MHz).

The high frequency component signal $E_H$ outputted by the filter device 2 are applied to the amplitude detector 3 and the zero cross generator 4 (e.g. amplitude limiter). A zero cross signal outputted by the zero cross generator 4 is inputted to the gain control circuit 5 (or amplitude modulator) and amplitude-modulated by this circuit so that the amplitude thereof is equal to $E_H$, responding to a detection signal from the amplitude detector 3, so that an amplitude modulated signal is outputted. This amplitude modulated signal is applied to the blanking gate circuit 7. Switched there by the blanking signal 6, the amplitude modulated signal is sent to the adding circuit 8, which adds the low frequency component signal $E_L$ thereto to output the output signal 9.

Although, in the above embodiment, the filter device is so constructed that one channel $E_H$ is obtained for the high frequency component signal, it may be constructed so as to obtain a plurality of channels at need.

Figure 7:
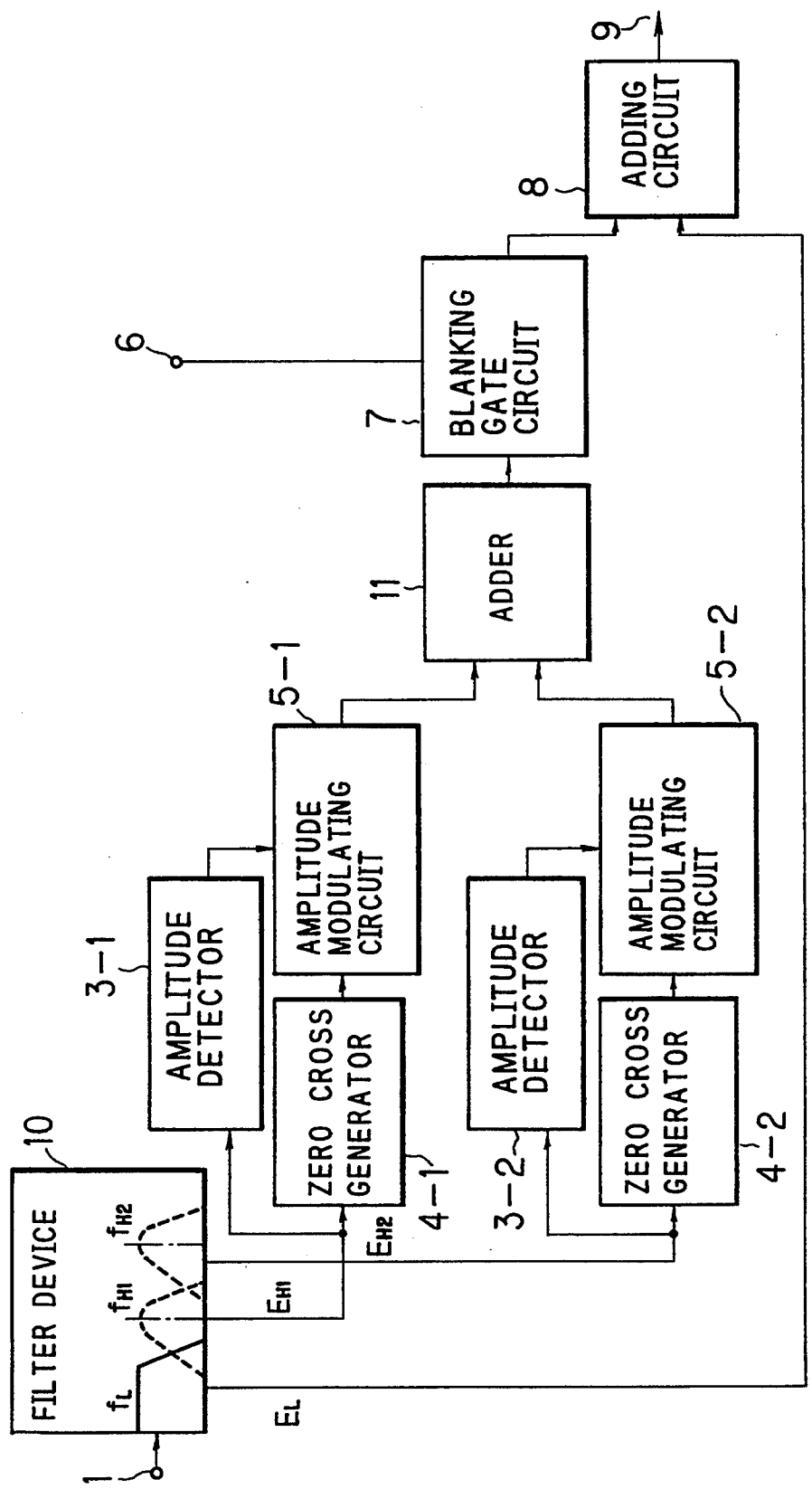
FIG. 7 is a block diagram showing another embodiment of the present invention.

In the filter device 10 indicated in FIG. 7, two band pass filters, whose central frequencies are $f_{H1}$ and $f_{H2}$, respectively, are used, in order to obtain two channels ($f_{H1}$ and $f_{H2}$) for the high frequency component signal.

Further 3-1 and 3-2 are amplitude detectors for the two channels; 4-1 and 4-2 are zero cross generators for the two channels; 5-1 and 5-2 are amplitude modulating circuits for the two channels; and 11 is an adder. The two output signals $E_{H1}$ and $E_{H2}$ from the filter device 10 are applied to the different channels, respectively, to be processed as described previously.

Figures 8A, 8B:
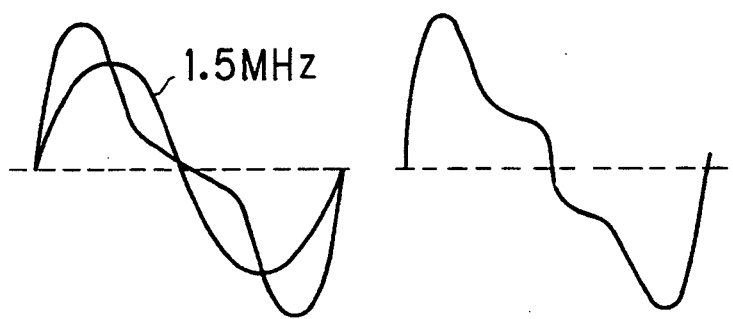
FIG. 8 shows waveforms indicating an example of an inputted and an outputted signal in the embodiment indicated in FIG. 1.
Figure 9A:
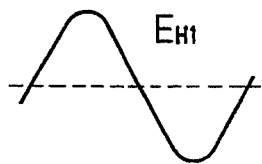
FIG. 9 shows waveforms indicating an example of an inputted and an outputted signal in the embodiment indicated in FIG. 7.
Figure 9C:
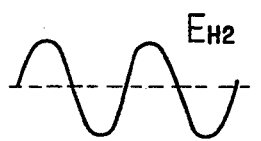
Figure 9B:
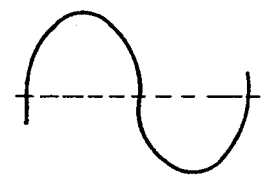
Figure 9D:
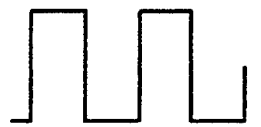
Figure 9E:
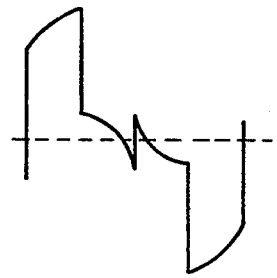
Figure 11A:
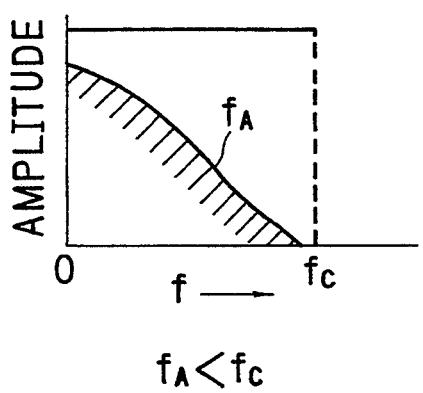
FIG. 11 shows characteristic curves indicating a relation between the frequency $f_A$ of an audio signal and the transmission band.
Figure 11B:
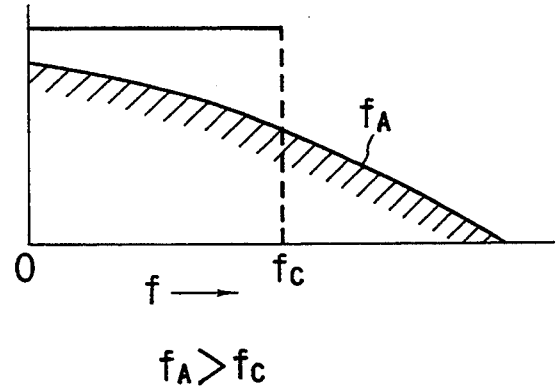
Figure 11C:
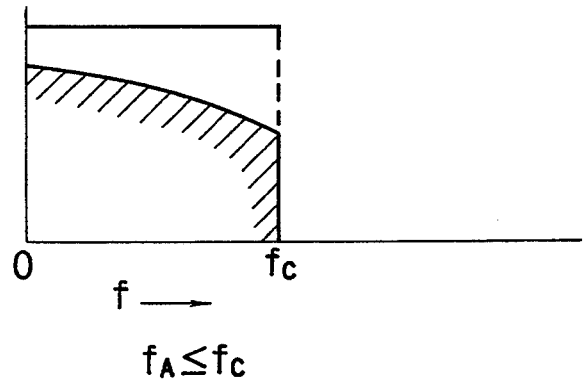

In the embodiment indicated in FIG. 1, supposing that the inputted signal consists in a signal of 3 MHz multiplexed on a signal of 1.5 MHz as indicated by (a) in FIG. 8, an output signal having a waveform as indicated by (b) in the same figure is obtained.

On the contrary, in the embodiment indicated in FIG. 7, the two output signals $E_{H1}$ and $E_{H2}$ described above are represented by (a) and (c), respectively, in FIG. 9. Since the output signal obtained by adding $E_L$ to the output signal of the amplitude modulating circuit 5-1 is represented by (b) in FIG. 9 and the output signal of the amplitude modulating circuit 5-2 is represented by (d) in FIG. 9, the output signal of the adding circuit 8 is represented by (e) in FIG. 9.

Consequently, although the embodiment indicated in FIG. 6 is suitable from the point of view of the simplicity of the construction, in order to obtain a more sharp contour also for high frequency component signals, the system indicated in FIG. 7 or those systems, for which number of channels n>2, are preferable.

As explained above, by using the equalizing circuit indicated in FIG. 1, since a video signal, whose band is divided into a low frequency component signal and a high frequency component signal and rising and falling of the waveform of the video signal are made sharp by adding a zero cross signal obtained from the high frequency component signal to the low frequency component signal described above, it is possible to obtain an image, which is matched to characteristics of the visual sense and thus comfortable to see.

FIG. 10 shows an embodiment of the equalizing circuit for audio signals according to the present invention, in which reference numeral 21 is an audio signal, whose band is restricted; and 22 is a filter device.

It is supposed that the filter device 22 consists e.g. of one low pass filter having a cut-off frequency $f_L$ and 4 channel narrow band pass filters, whose central frequencies are $f_{H1}$, $f_{H2}$, $f_{H3}$ and $f_{H4}$, respectively, which are over $f_L$. 23 is an output terminal for the low frequency component signal $E_L$; 24 to 27 are output terminals for the high frequency component signals $f_{H1}$, $f_{H2}$, $f_{H3}$ and $f_{H4}$, respectively; 28-1 to 28-4 are squaring circuits; and 29-1 to 29-4 are band pass filters, whose central frequencies are $2f_{H1}$ to $2f_{H4}$, respectively.

30-1 to 30-4 are amplitude modulating circuits; 31-1 to 31-4 are envelope detectors; 32 is an adding circuit; 33 is an output signal; 34-1 to 34-4 are attenuators; and 35 is a switch.

The audio signal 21 is divided by the filter device 22 into a low frequency component signal $E_L$ and high frequency component signals $E_{H1}$ to $E_{H4}$ in frequency bands corresponding to different channels.

The high frequency component signals $E_{H1}$ to $E_{H4}$ are applied to the squaring circuits 28-1 to 28-4 and the envelope detectors 31-1 to 31-4, respectively. Harmonic wave component signals, whose central frequencies are $2f_{H1}$ to $2f_{H4}$, are extracted from the output signals of the different squaring circuits through the band pass filters 29-1 to 29-4, respectively.

Here, if it is supposed that e.g. the high frequency component signal $E_{H1}$, whose central frequency is $f_{H1}$, is expressed by $$E_{H1} = e_1 \cos \omega_{H1} t \quad (1)$$

the squared output thereof $E_{H1}^2$ is given by $$E_{H1}^2 = (e_1^2/2) + (e_1^2/2) \cos 2\omega_{H1} t \quad (2)$$

The component given by the second term in the right member of Eq. (2) is extracted through the band pass filter described above.

Figures 12A, 12B:
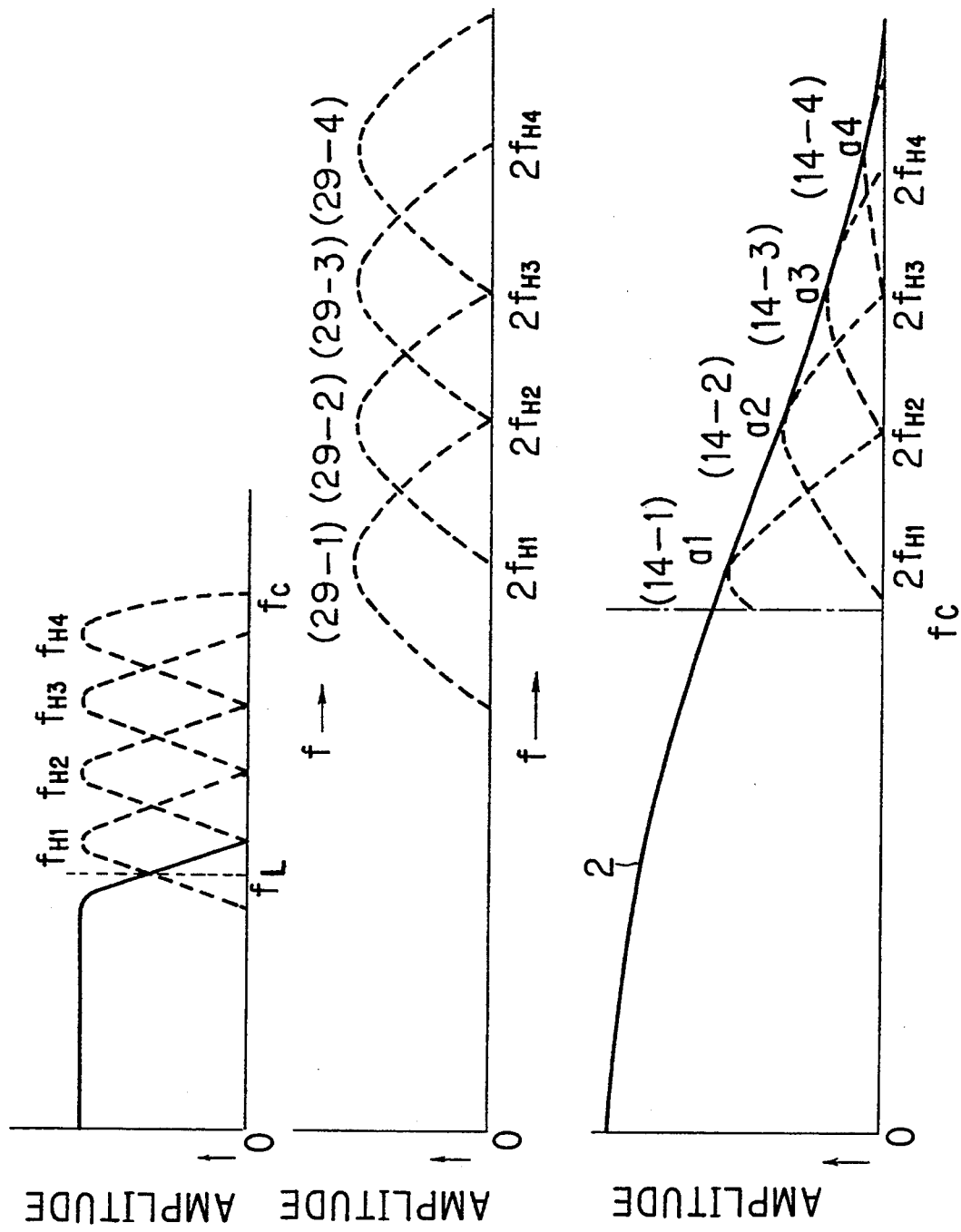
FIG. 12 shows frequency characteristics for explaining the operation of the embodiment indicated in FIG. 10.
Figure 15A:
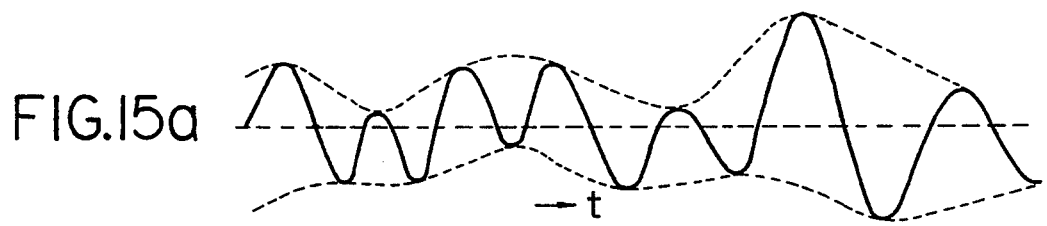
FIG. 15 shows waveforms for explaining the operation of the embodiment indicated in FIG. 14.
Figure 15B:
Figure 15C:
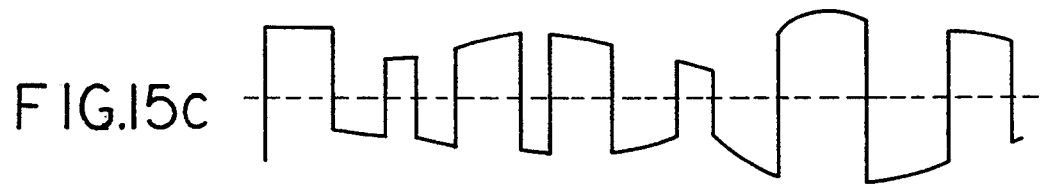
Figure 15D:
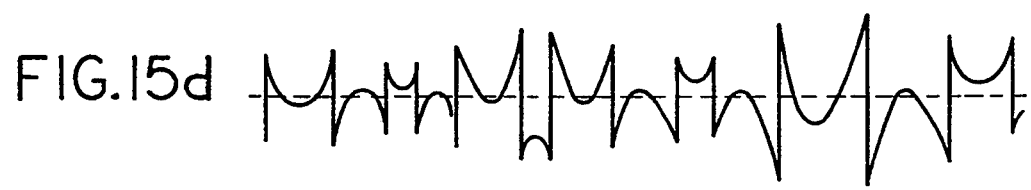
Figure 15E:
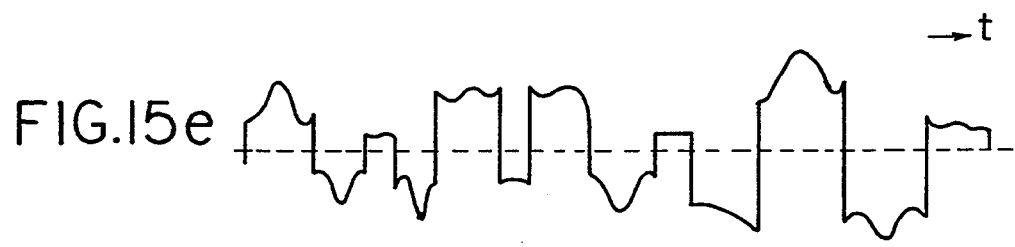

(a) in FIG. 12 shows output characteristics of the filter device 22 and (b) output characteristics of the different band pass filters 29-1 to 29-4. Denoting the component of $2f_{H1}$, by $a_1$; the component of $2f_{H2}$ by $a_2$; the component of $2f_{H3}$ by $a_3$; and the component of $2f_{H4}$ by $a_4$, by adding the components $a_1$ to $a_4$ to the component below $f_L$, an output as indicated by (c) in FIG. 12 is obtained and thus it is possible to reproduce the component lost by the cut-off filter of $f_L$.

The envelope detectors 31-1 to 31-4 detect amplitudes of the different high frequency component signals $E_{H1}$ to $E_{H4}$ and send different detection signals to the amplitude modulating circuits 30-1 to 30-4, respectively. The gain control circuits amplitude-modulate the different high frequency component signals with the respective detection signals and output amplitude-modulated signals gain-controlled so as to be proportional to the amplitudes $a_1$ to $a_4$ of $E_{H1}$ to $E_{H4}$. The signals thus outputted are combined with the low frequency component signal $E_L$ by the adding circuit 32 through the attenuators 34-1 to 34-4 to obtain a synthesized signal.

Originally smaller harmonic distortion is better. However, it is known that, as indicated by the diagram for explaining the sensitivity of hearing sense indicated in FIG. 13, the hearing sense is sensitive to the phase of sound below a frequency $f_O$ (1.5 to 2.5 kHz), but it is insensitive to the phase and sensitive only to the amplitude for the signals over $f_O$ indicated by a broken line in FIG. 13.

Consequently, if $f_C > f_O$ in FIG. 12, the components over $f_C$ are not sensed as distortion and it is as indicated in FIG. 12 that they are close to signals of the original signal source, i.e. signals before the cut-off at $f_C$, in the amplitude.

Further it is possible, of course, to increase infinitely the coefficients of the attenuators 34-1 to 34-4 so as to decrease the harmonic components to zero. Furthermore it is possible to add thereto the third harmonic component obtained by multiplying the different harmonic component signals $E_{H1}$ to $E_{H4}$ by the components outputted by the respective squaring circuits. Still further it is possible to provide a switch 35 capable of selecting one of the output signal 33 (synthesized signal) from the adding circuit 31 and the audio signal.

FIG. 14 shows still another embodiment of the audio signal equalizing circuit according to the present invention, in which the same reference numerals as those used in FIG. 10 represent identical or similar circuits and 36-1 to 36-4 are zero cross generators constituting the zero cross detecting means described above. 37-1 to 37-4 are differential amplifiers constituting difference signal outputting means.

At first, the high frequency component signal $E_{H1}$ from the filter device 22 ((a) in FIG. 15) is applied to the zero cross generator 36-1 and transformed into a zero cross signal ((b) in FIG. 15), which is a rectangular wave clearly rising and falling at 0 level.

The amplitude detector (envelope detector) 31-1 detects the amplitude indicated by broken lines indicated by (a) in FIG. 15. The amplitude modulator 30-1 amplitude-modulates the zero cross signal described above by using a detection signal thus obtained to have the amplitude modulated signal having a waveform indicated by (c) in FIG. 15, which is gain-controlled. The amplitude modulated signal and the high frequency component signal $E_{H1}$ are applied to the differential amplifier 37-1 to obtain a difference component signal between the two signals indicated by (d) in FIG. 15. Since the amplitude modulated signal ((c) in FIG. 15) described above and the high frequency component signal $E_{H1}$ ((a) in FIG. 15) are in accordance with each other in the amplitude, the difference component signal described above is composed mainly of harmonic wave components, because the fundamental component is nullified. This difference component signal is subjected to adjustment in the harmonic components described above by making it pass through the attenuator 34-1 and then inputted to the adding circuit 31.

Similar processing is effected also for the other high frequency component signal $E_{H2}$ to $E_{H4}$ from the filter device 22 and the adding circuit 31 combines the different difference component signals and the low frequency component signal $E_L$ so as to output a synthesized signal ((e) in FIG. 15) to the switch 35.

FIG. 16 shows still another embodiment of the audio signal equalizing circuit, in which the same reference numerals as those used in FIG. 14 represent identical or similar circuits and 38-1 to 38-4 are adders constituting addition component signal outputting means. 39-1a, 39-1b; 39-2a, 39-2b; 39-3a, 39-3b; and 39-4a, 39-4b are paired attenuators linked with each other having coefficients $k_1$, $(1-k_1)$; $k_2$, $(1-k_2)$; $k_3$, $(1-k_3)$; and $k_4$, $(1-k_4)$, respectively.

Figure 17A:
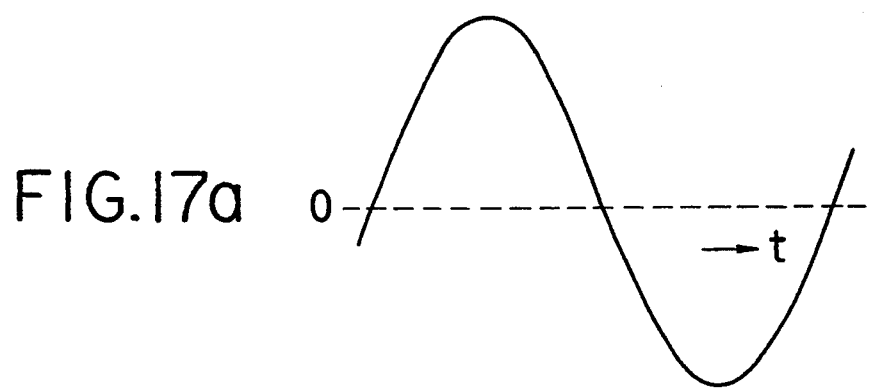
FIG. 17 shows waveforms for explaining the operation of the embodiment indicated in FIG. 16.
Figure 17B:
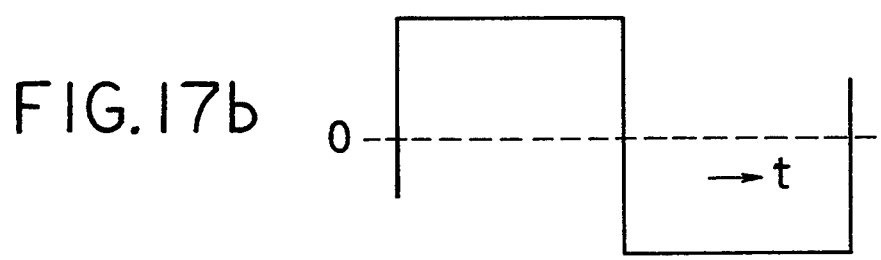
Figure 17C:
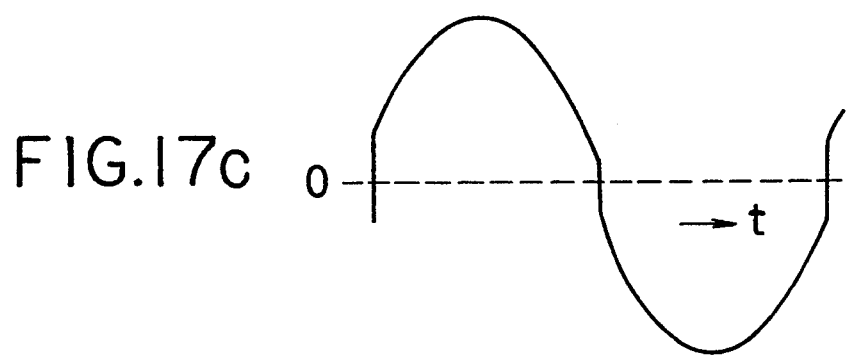

The high frequency component signal $E_{H1}$ is applied to the zero cross generator 36-1. Supposing that $E_{H1}$ has e.g. a waveform indicated by (a) in FIG. 17, a zero cross signal indicated by (b) in the same figure is generated. This zero cross signal is amplitude-modulated by the amplitude modulator 30-1 with the amplitude detection signal described above to output the amplitude modulated signal gain-controlled so as to be equal to $E_{H1}$ in the amplitude. This amplitude modulated signal and the high frequency component signal $E_{H1}$ are multiplied by $k_1$ and $(1-k_1)$ by passing through the attenuators 39-1a and 39-1b, respectively, and added to each other by the adder 38-1 to form an addition component signal having a waveform indicated by (c) in FIG. 17, which is sent to the adding circuit 31.

Similar processing is effected also for the high frequency component signals $E_{H2}$, $E_{H3}$ and $E_{H4}$ described previously. In this case the coefficients of the different attenuators are set so that $k_1 < k_2 < k_3 < k_4$.

The adding circuit 31 combines the different addition signals and the low frequency component signal $E_L$ to output the synthesized signal 33 to the switch 35.

As explained above, by using the audio signal equalizing circuits indicated in FIGS. 10, 14 and 16, it is possible to reproduce rich sound quality from the point of view of the hearing sense by adding high frequency component signals outside of the band at reproducing audio signals, whose band is restricted.

FIG. 18 shows still another embodiment of the audio signal equalizing circuit according to the present invention, in which reference numeral 41 is an input terminal for audio component signals and 42 is a band pass filter corresponding to frequency component extracting means. 43 is a 90° phase shifter and 44 and 45 are zero cross generators, for which hard limiters (amplitude limiters) are used, these constituting zero cross detecting means. 46 is a multiplier (or exclusive NOR circuit) and 47 is a band pass filter, these constituting harmonic wave component extracting means. 48 is an amplitude modulator corresponding to amplitude modulating means; 49 is an envelope detector; and 50 is an adding circuit corresponding to signal synthesizing means. 51 is an amplitude adjuster.

Figure 19:
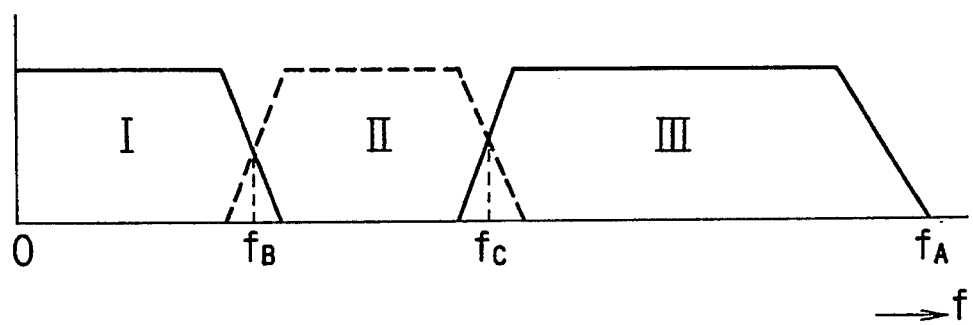
FIG. 19 shows frequency characteristics for explaining the operation of the embodiment indicated in FIG. 18.

Audio component signals given to the input terminals 41 are supposed to be in a frequency band below $f_C$ as indicated in FIG. 19 and a frequency component signal having a band of $f_B \sim f_A$ narrower than that frequency band is extracted from that signal by the band pass filter 42. That frequency component signal is applied to the zero cross generator 45 as well as to the zero cross generator 44 through the 90° phase shifter.

The zero cross generators 44 and 45 detect zero cross components in the frequency component signal described above to generate zero cross detection signals, which are outputted to the multiplier 46. The multiplication output is inputted to the band pass filter 47 and a harmonic wave component signal in a high frequency band of $f_C \sim f_A$ indicated in FIG. 19 is extracted therefrom.

On the other hand the frequency component signal described above is amplitude-detected by the envelope detector 49. An amplitude detection signal thus obtained is sent to the amplitude modulator 48, where the frequency component signal is amplitude-modulated. An amplitude modulated signal from the amplitude modulators 48 is combined with the audio component signal described previously by the adding circuit 50 through the amplitude adjuster.

Owing to such processing, since the harmonic wave component in the high frequency band indicated by III in FIG. 19 is added to the audio component signal, which consists originally only of the frequency band components I+II in the figure, the latter is transformed into a signal producing rich sound quality. In this case, the sound is comfortable to hear, because no so-called mutual modulation distortion is produced. It is a matter of course that the degree of addition of the harmonic wave component described above can be arbitrarily chosen by regulating the amplitude adjuster 51.

Figure 20:
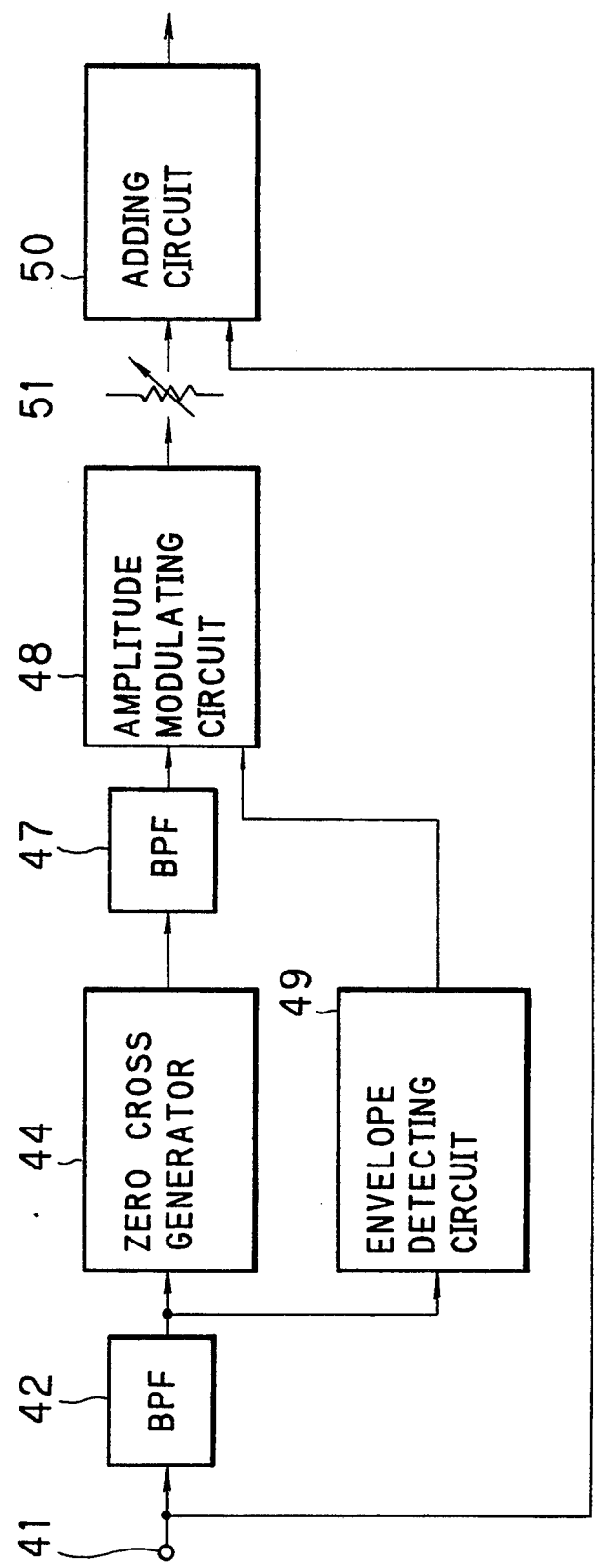
FIG. 20 is a block diagram showing still another embodiment of the present invention.

FIG. 20 shows still another embodiment of the present invention, in which the same reference numerals as those used in FIG. 18 represent identical or similar circuits. In the embodiment indicated in FIG. 20 the output of the band pass filter 42 is applied directly to the zero cross generator 44; and the harmonic wave component signal having frequencies over $f_A$ is extracted from the output of the zero cross generator 44 by the band pass filter 47, amplitude-modulated by the amplitude detection signal in the amplitude modulator 48, and combined with the audio component signal by the adding circuit through the amplitude adjuster 51, while in the embodiment indicated in FIG. 18 the main component of the harmonic wave was the second harmonic wave of the output of the filter 42 (component in the band indicated by II described previously).

In the present embodiment, since the third harmonic wave component of the output of the band pass filter 42 is contained abundantly in the main component of the harmonic wave, it is the optimum that the pass band of the filter 42 is $f_C/3 \sim 2f_C/3$.

Although it was supposed in the embodiment indicated in FIG. 18 that $f_B = \frac{1}{3} f_C$ in the filter 42, it may be selected to be $f_B < \frac{1}{3} f_C$. In this case the band indicated by III is over $2f_B$.

As explained above, by using the equalizing circuits indicated in FIGS. 18 and 20, it is possible to reproduce rich sound quality on auditory feeling by adding the harmonic wave component signal outside of the band to the audio signal, whose band is restricted, at reproducing it.

Now it is for the frequency components over $f_L = 2$ kHz in the audio signal described previously that it is efficient for improving the sound quality by adding the harmonic component to the audio signal. Now, supposing that the high frequency component $e_1$ over $f_L$ in this audio signal e is a composite wave expressed by Eq. (3), which is divided tentatively by a group of filters with an interval of a band $f_B$ ($\omega_B = 2\pi f_B$) so as to have a frequency distribution as indicted in FIG. 22, denoting a synthesized odd numbered harmonic wave component signal of all the odd numbered harmonic wave components $E_{A1}$ to $E_{An}$ taken out for every odd number from the lowest frequency by $E_A$ and a synthesized even numbered harmonic wave component signal of all the even numbered harmonic wave components $E_{B1}$ to $E_{Bn}$ by $E_B$, $e_1$ is given by Eq. (5).

$$E = \cos\omega_1 t + k\cos\omega_2 t \qquad (3)$$

$$e = E^2 = \cos^2\omega_1 t + k^2\cos^2\omega_2 t + 2k\cos\omega_1 t \cdot \cos\omega_2 t \qquad (4)$$

$$= \left\{ \frac{1}{2} \cos2\omega_1 t + \frac{k^2}{2} \cos^2\omega_2 t + k\cos(\omega_1 + \omega_2)t \right\}$$

$$= \left\{ \frac{1}{2} + \frac{k^2}{2} + k\cos(\omega_1 + \omega_2)t \right\}$$

$$e_1 = E_A + E_B \qquad (5)$$

On the other hand, denoting the difference between $E_A$ and $E_B$ by $e_2$, $$e_2 = E_A - E_B \qquad (6)$$

and multiplying $e_1$ by $e_2$, $$e_1 \times e_2 = E_A^2 - E_B^2 \qquad (7)$$

For example, if $E_A$ is expressed by $\cos\omega_1 t$ and $E_B$ by $k\cos\omega_2 t$ in Eq. (3), the multiplication output thereof $e_1 e_2$ is given by $$e_1 e_2 = \frac{1}{2} - \frac{k^2}{2} + \frac{\cos2\omega_1 t}{2} - k^2 \frac{\cos2\omega_2 t}{2} \qquad (8)$$

Therefore the harmonic wave component $[e_1 e_2]_H$ in the multiplication output is given by $$[e_1 e_2]_H = \frac{1}{2} \cos2\omega_1 t - \frac{k^2}{2} \cos2\omega_2 t \qquad (9)$$

However, if the frequency of the composite wave given by Eq. (3) is within $f_B$, the following equation is valid:

$$[e_1 e_2]_H = \frac{1}{2} \cos2\omega_1 t - \frac{k^2}{2} \cos2\omega_2 t + k\cos(\omega_1 + \omega_2)t \qquad (10)$$

Figure 23:
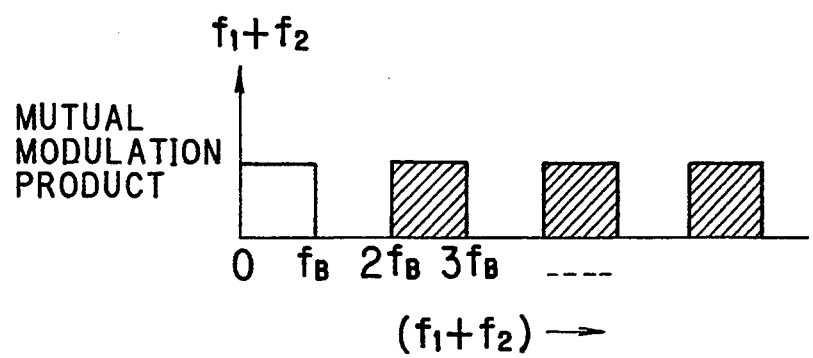
Figure 24A:
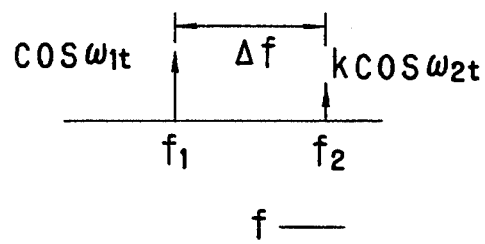
FIG. 24 shows a composite wave (a) and harmonic wave components of the squared wave of the composite wave (b)
Figure 24B:
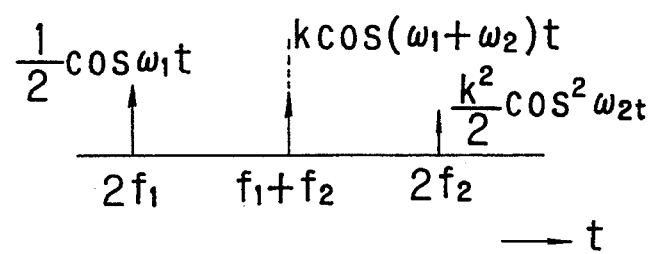

The difference between Eq. (9) and Eq. (10) consists in presence or absence of the term including $(\omega_1 + \omega_2)$. The term including $(\omega_1 + \omega_2)$ in Eq. (10) corresponds to the mutual modulation component and from the point of view of the hearing sense it is better that this component doesn't exist. As indicated in FIG. 23, this mutual modulation component is produced by the difference between $\omega_1$ and $\omega_2$ ($f_1 - f_2$ in FIG. 23) and Eq. (9) or Eq. (10) is valid.

That is, as clearly seen from FIG. 23,
if $0 < (f_1 - f_2) \leq f_B$,
the mutual modulation component $(f_1 + f_2)$ exists,
if $f_B < (f_1 - f_2) \leq 2f_B$,
the mutual modulation component $(f_1 + f_2)$ doesn't exist, and
if $2f_B < (f_1 - f_2) \leq 3f_B$,
the mutual modulation Component $(f_1 + f_2)$ exists, and the mutual modulation component is either produced or not produced for every $f_B$.

Figure 21:
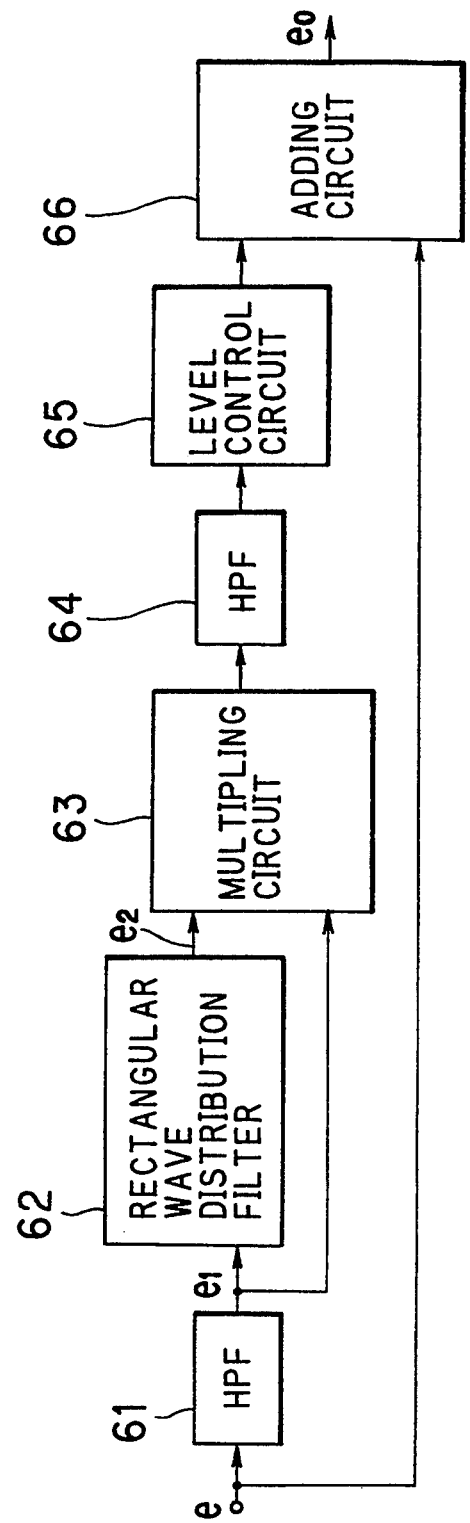
FIG. 21 is a block diagram showing still another embodiment of the present invention.

FIG. 21 shows an embodiment of the audio signal equalizing circuit according to the present invention, based on this principle described above, in which reference numeral 61 is a high pass filter (HPF); 62 is a rectangular wave distribution filter device; 63 is a multiplying circuit; 64 is a high pass filter (HPF); 65 is a level control circuit; and 66 is an adding circuit.

Figure 22:
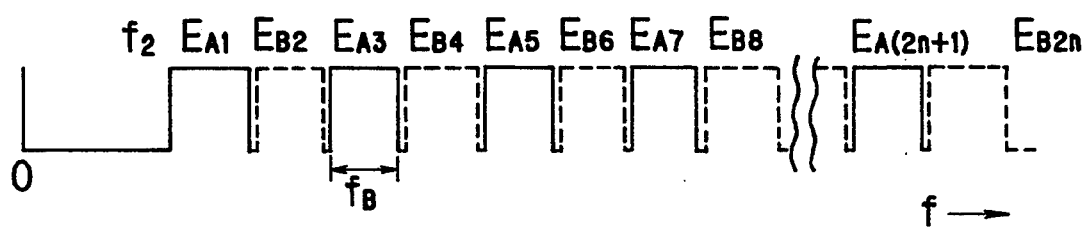
FIG. 22 shows a waveform indicating distribution of odd number-th harmonic wave components and even number-th harmonic wave components of an audio signal.

In the embodiment described above, the audio component signal e is applied to the high pass filter 61, which extracts a first harmonic wave component signal $e_1$ ($=E_A+E_B$) over $f_2$. This signal $e_1$ is applied to the rectangular wave distribution filter device 62. This device includes a group of filters having approximately rectangular frequency distributions as indicated in FIG. 22 and generates a second harmonic wave component signal $e_2$ ($=E_A-E_B$), starting from the signal $e_1$.

The first and the second harmonic wave signal $e_1$ and $e_2$ are inputted to the multiplying circuit 63, which outputs a multiplication signal $e_1 e_2$ given by Eq. (7). The high frequency component $[e_1 e_2]_H$ given by Eq. (9) (or Eq. (10)) is extracted by the high pass filter 64. At the same time the addition level $\alpha$ is regulated by the level control circuit 65 and the audio component signal e is added thereto by the adding circuit 66 to obtain a synthesized signal $e_O$.

If the audio component signal e described above is expressed by $e = \cos\omega_1 t + k\cos\omega_2 t$, the synthesized signal $e_O$ thereto is given by $$e_O = \cos\omega_1 t + \alpha\cos2\omega_1 t + k\cos\omega_2 t - \alpha k^2\cos2\omega_2 t \qquad (11)$$

or $$e_O = \cos\omega_1 t + \alpha\cos2\omega_1 t + k\cos\omega_2 t - \alpha k^2\cos 2\omega_2 t + 2\alpha k\alpha\cos(\omega_1 + \omega_2)t \qquad (12)$$

$e_O$ expressed by Eq. (11) is the desired output and $e_O$ expressed by Eq. (12) includes the mutual modulation component. However the mutual modulation component is contained not always as it was heretofore, but by the system according to the present invention the mutual modulation product is statistically equal to ½.

Figure 25:
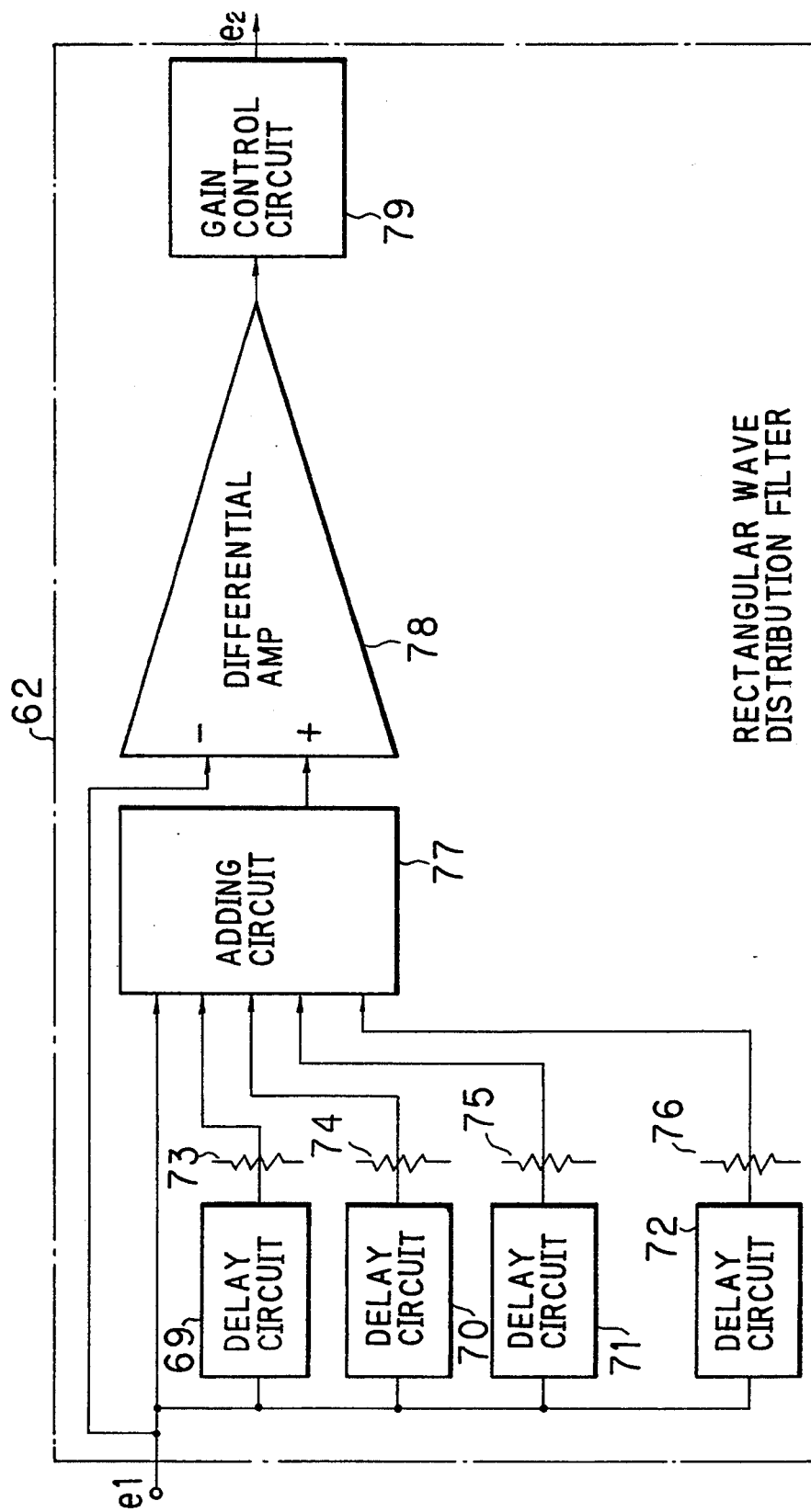
FIG. 25 is a block diagram indicating an example of the construction of a rectangular wave distributed filtering device.

FIG. 25 shows an example of the construction of the rectangular wave distribution filter device 62 described above, in which reference numerals 69 to 72 are delaying circuits having delay times of $\tau$, $\tau/3$, $\tau/5$ and $\tau/(2n+1)$, respectively; 73 to 76 are amplitude controller having coefficients of $k_1$, $k_3$, $k_5$ and $k_{2n+1}$, respectively; 77 is an adding circuit; 78 is a subtracter (differential amplifier) and 79 is a gain control circuit.

In the device indicated in FIG. 25, an inputted signal passes through the delaying circuits 69 to 72 and the amplitude controller 73 to 76 to output amplitudes of $k_1\epsilon^{-j\omega\tau}$, $k_3\epsilon^{-j\omega(\tau/3)}$, $k_5\epsilon^{-j\omega(\tau/5)}$ and $k_{2n+1}\epsilon^{-j\omega(\tau/(2n+1))}$, respectively.

In this case, if there are no delaying circuits 70 to 72 and $k_3$, $k_5$ and $k_{2n+1}$ are 0, the output of the adding circuit 77 is given, with respect to the input signal, by $$1+k_1\epsilon^{-j\omega\tau} \quad (13)$$

and the frequency characteristics thereof $|k_1(\omega)|$ is expressed by $$|k_1(\omega)| \approx 1+k_1 \cos \omega\tau \quad (14)$$

Here $k_1<1$. (a) in FIG. 26 indicates the characteristic curve of $|k_1(\omega)|$. When the delaying circuits 70 to 72, etc. are added thereto, the output stated above with respect to the input signal is expressed by $$1+k_1\epsilon^{-j\omega\tau}+k_3\epsilon^{-j\omega(\tau/3)}+k_5\epsilon^{-j\omega(\tau/5)}+\ldots$$
$$k_{2n+1}\epsilon^{-j\omega(\tau/(2n+1))} \quad (15)$$

Here, supposing that $k_3$, $k_5 \ldots k_{2n+1}$, the frequency characteristics $|k_2(\omega)|$ is given by $$|k_2(\omega)| \approx 1 + k_1\cos\omega\tau + k_3\cos\frac{\omega\tau}{3} + k_5\cos\frac{\omega\tau}{5} \ldots +$$
$$k_{2n+1}\cos\frac{\omega\tau}{2n+1} \quad (16)$$

In this case, if the coefficients are set so that $$k_3=-k_1/3, k_5=-k_1/5, k_7=-k_1/7, \ldots \quad (17)$$

Eq. (15) represent characteristics, as indicated by (b) in FIG. 26, in which a rectangular wave distribution is added to a flat distribution.

Figure 26A:
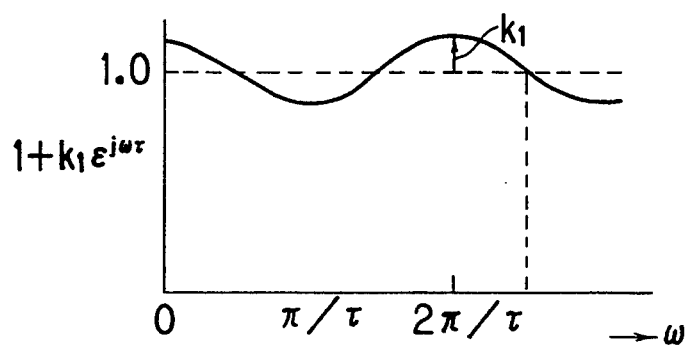
FIG. 26 shows waveforms at different parts in the rectangular wave distributed filtering device.
Figure 26B:
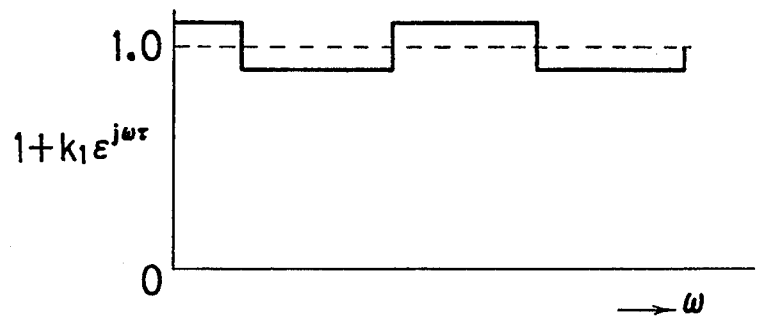
Figure 26C:
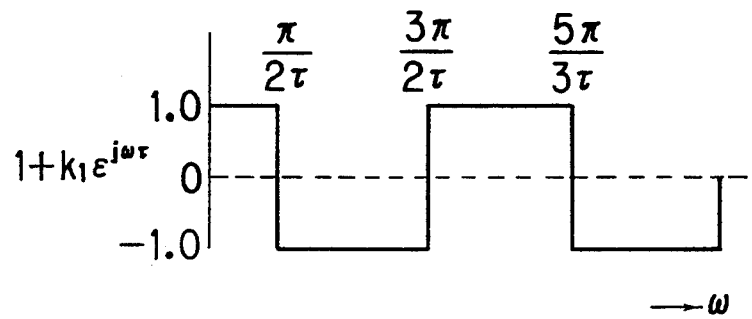

After the output of the adding circuit 77 has been inputted to the subtracter 78 to subtract the input signal therefrom, the amplitude of an output thus obtained is regulated by the gain control circuit 79 to obtain an output $e_2$ having a rectangular wave distribution indicated by (c) in FIG. 26. As clearly seen from FIG. 26, the polarity of the different signals changes for every $\omega=\pi/2$. If tentatively $\tau=1$ msec is set, the polarity is inverted for every f=500 Hz.

As explained above, by using the equalizing circuit indicated in FIG. 21, it is possible to generate high frequency wave components including small mutual modulation components and to obtain distinct sound having a rich sound quality.

Figure 27:
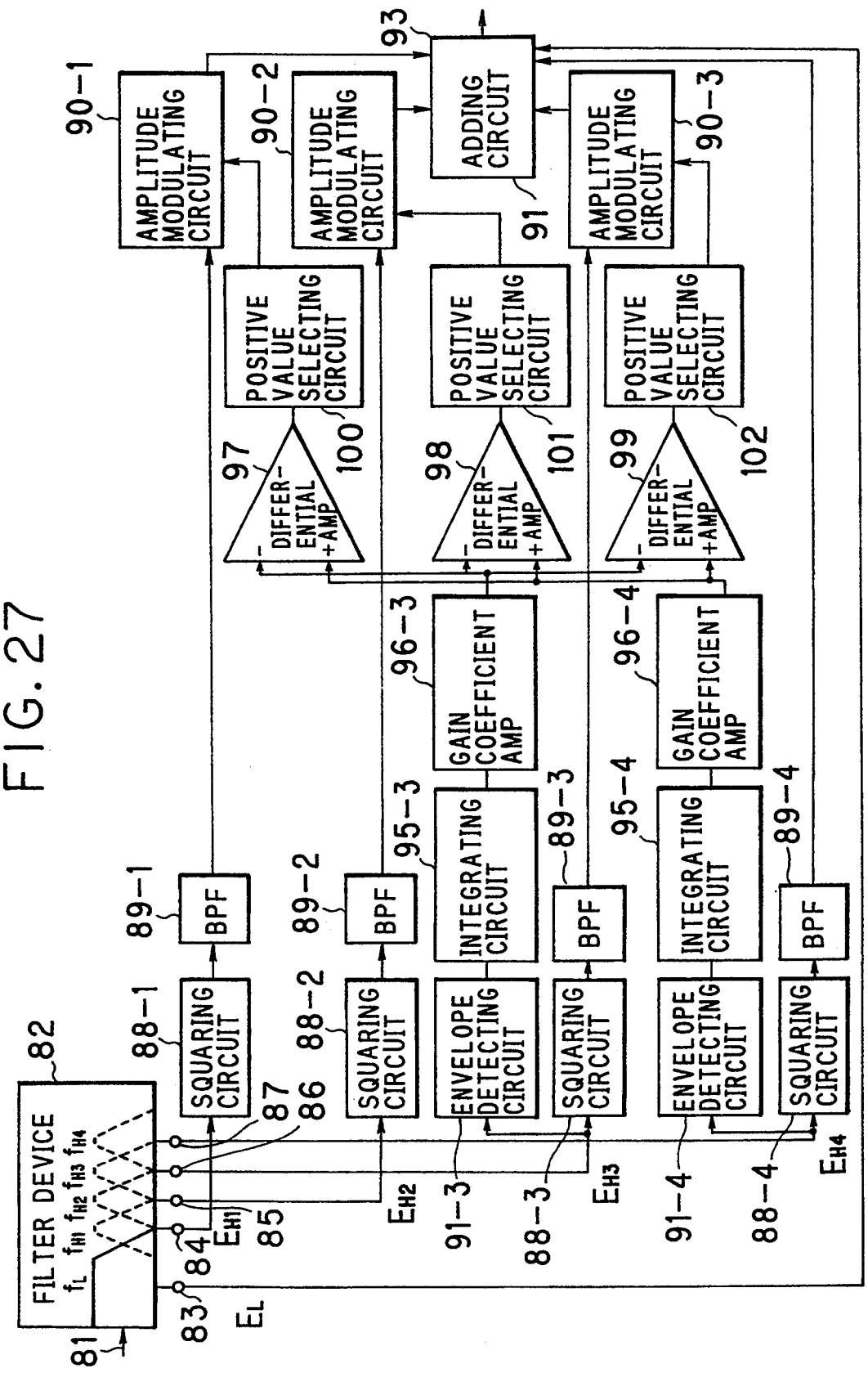
FIG. 27 is a block diagram showing still another embodiment of the present invention.

FIG. 27 shows still another embodiment of the audio signal equalizing circuit according to the present invention, in which reference numeral 81 is an audio signal, whose band is restricted; 82 is a filter device; 83 to 87 are output terminals; 88-1 to 88-4 are squaring circuits; 89-1 to 89-4 are band pass filters (BPF); 90-1 to 90-3 are amplitude modulating circuits; 91-3 and 91-4 are envelope detectors; 95-3 and 95-4 are integrator; 96-3 and 96-4 are gain coefficient amplifiers; 97, 98 and 99 are differential amplifiers; 100, 101 and 102 are positive value selecting circuits.

In FIG. 27, high frequency outputs (output terminals 86 and 87) having high frequences are detected by the envelope detectors 91-3 and 91-4, respectively. Outputs thereof are smoothened by the integrating circuits 95-3 and 95-4, respectively. Smoothened outputs thereof are applied to the gain coefficient amplifiers 96-3 and 96-4, respectively. An output of the gain coefficient amplifier 96-3 is inputted to the negative input of the differential amplifiers 97, 98 and 99, while an output of the gain coefficient amplifier 96-4 is inputted to the positive input of the differential amplifiers 97, 98 and 99. Harmonic wave signals, whose central frequencies are 2fH1, 2fH2 and 2fH3, coming from the BPF 89-1, 89-2 and 89-3, are amplitude-modulated by using control signals from the differential amplifiers 97, 98 and 99, respectively. Consequently the attenuators 34-1 to 34-4 indicated in FIG. 10 are unnecessary.

Figure 28A:
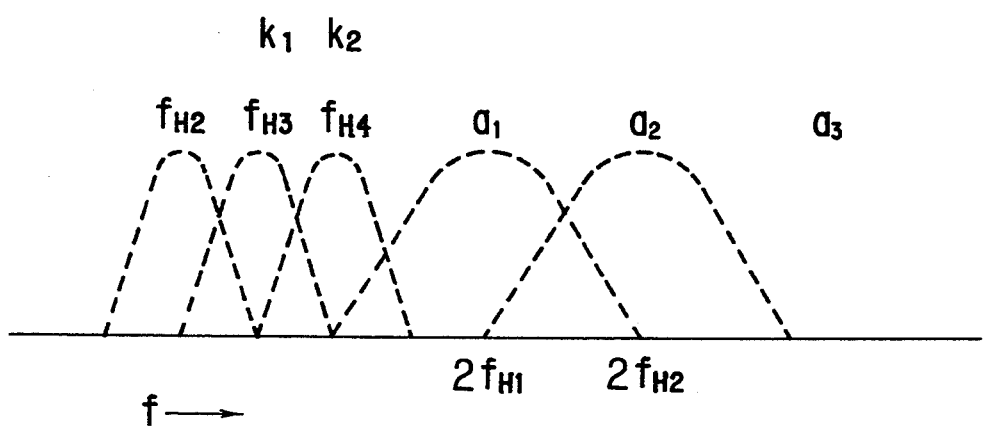
FIG. 28 shows distribution of existing frequencies of mutual modulation components.
Figure 28B:
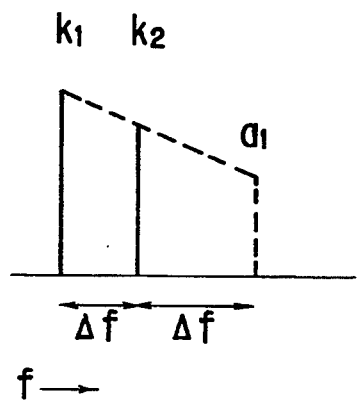
Figure 28C:
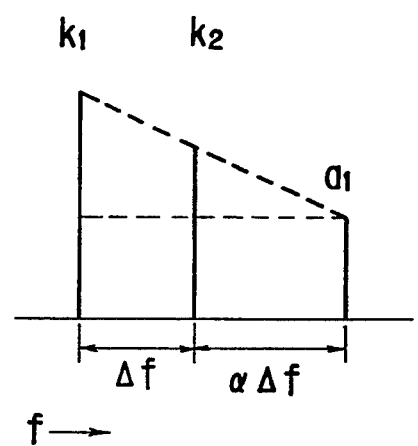

FIG. 28 is a diagram for explaining distribution of gain differences. In a partial figure A in FIG. 28, detection outputs of the harmonic wave component signals fH3 and fH4 are denoted by k1 and k2 and the harmonic wave components by a1, a2 and a3. The bands are so arranged that the difference between the harmonic wave component signals fH3 and fH4 is equal to the difference between fH4 and 2fH1, in the case where the interval $\Delta f$ between the harmonic wave component signals fH3 and fH4 is equal to the interval between the harmonic wave component signal fH4 and the harmonic wave component signal 2fH1, i.e. the latter being equal to $\alpha f$, as indicated by B in FIG. 28. At this time, as clearly seen from the partial figure B in FIG. 28, the harmonic wave component to be added a1 is expressed by Eq. (18).

$$k1-k2=k2-a1$$

from which $$a1=2k2-k1 \quad (18)$$

In FIG. 27 the gain coefficient amplifier 96-3 has a coefficient "1", while the gain coefficient amplifier 96-4 has a coefficient "2". Then, in the differential amplifier 97, the harmonic wave component to be added a1 is obtained by controlling the central frequency 2fH1 from the BPF 89-1, starting from the relation $(2k2-k1)=a1$. This procedure is identical also for a1 and a3. In the case where different channels are arranged with a constant interval, a2 and a3 are expressed by Eqs. (19) and (20) indicated below.

$$a2=3k2-2k1 \quad (19)$$

$$a3=3k2-3k1 \quad (20)$$

In the case where the channels are not arranged with a constant interval, corresponding corrections should be effected. For example, in the case where the interval between fH4 and 2fh1 is $\alpha\Delta f$, a relation given by Eq. (21) indicated below is valid.

$$k1-k2=(k2-a1))/\alpha$$

from which $$a1 = (1+\alpha)k2 - 2k1 \qquad (21)$$

Consequently the coefficient of the gain coefficient amplifier 96-4 may be set at "$1+\alpha$", which is the value of Eq. (21), while the coefficient of the gain coefficient amplifier 96-3 may be set at "$\alpha$".

Figure 29A:
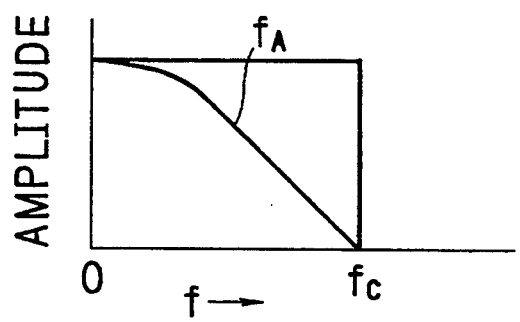
FIG. 29 are characteristic curves for explaining the operation of the embodiment indicated in FIG. 27.
Figure 29B:
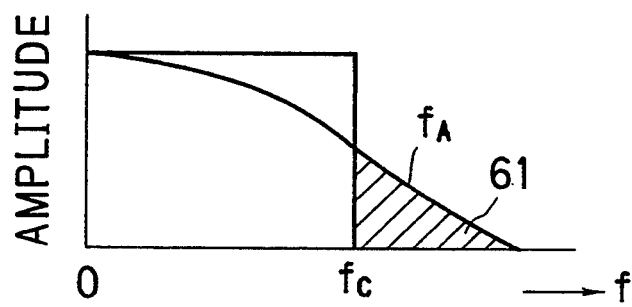
Figure 29C:
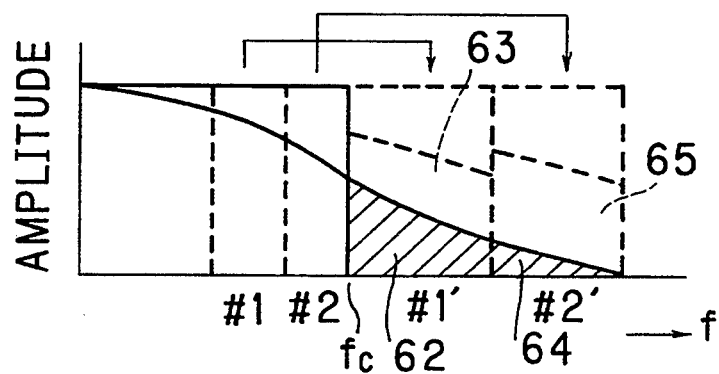

Further, in the case where the result of the above operation is negative, the control value is set at zero (0). For this reason, in FIG. 27, there are disposed the positive value selecting circuits 110 to 112. For example, in the case where the signal is as indicated by A in FIG. 29 ($f_A \leq f_C$), 2fH1 may be zero. In this case, since the value of Eq. (18) is negative, the output is set at zero by the positive value selecting circuit 110.

Owing to the circuit indicated in FIG. 27 it is possible to add harmonic wave components having suitable magnitudes by controlling harmonic waves on the basis of the distribution at $f \leq f_C$ of the audio signal, whose band is restricted.

As explained above, according to the embodiment indicated in FIG. 27, since harmonic wave components can be added at reproducing audio signals (AM or FM), whose band is restricted in several kHz, without giving any unnatural feeling by forming high frequency signals outside of the band, responding to distribution of signals within the band, it is possible to reproduce rich sound quality.

What is claimed is:

1. An audio signal equalizing circuit comprising:
    filter means for separating, from an audio component signal, a first harmonic wave component signal which includes a sum component of an odd numbered harmonic wave component signal synthesized from a plurality of odd numbered harmonic wave components and an even numbered harmonic wave component signal synthesized from a plurality of even numbered harmonic wave components and a second harmonic wave component signal which includes a difference component between said odd numbered harmonic wave component signal and said even numbered harmonic wave component signal;
    multiplying means for multiplying said first harmonic wave component signal by said second harmonic wave component signal to output a multiplication signal; and
    signal synthesizing means for combining said multiplication signal and said audio component signal to obtain a synthesized signal.

2. An equalizing circuit according to claim 1, wherein said filter means includes:
    first harmonic wave component extracting means for extracting, from said audio component signal, said first harmonic wave component signal which includes said sum component of said odd numbered harmonic wave component signal synthesized from said plurality of odd numbered harmonic wave components and said even numbered harmonic wave component signal synthesized from said plurality of even numbered harmonic wave components; and
    second harmonic wave component generating means for generating, from said first harmonic wave component signal, said second harmonic wave component signal which includes said difference component between said odd numbered harmonic wave component signal and said even numbered harmonic wave component signal.

3. An equalizing circuit according to claim 2, wherein said second harmonic wave component generating means comprises:
    a plurality of delaying circuits having different delay times, to which said first harmonic wave component signal is applied;
    an adding circuit for adding outputs of said different delaying circuits and said first harmonic wave component signal; and
    a subtracting circuit for subtracting said first harmonic wave component signal from an output of said adding circuit.

4. An equalizing circuit for reproduced signals comprising:
    filter means, which divides a reproduced signal into a first component signal and a second component signal having different bands, and which outputs said first and second component signals;
    detecting means for detecting an amplitude of said second component signal to output an amplitude detection signal;
    signal processing means for subjecting said second component signal to predetermined signal processing to obtain a signal to be modulated;
    amplitude modulating means for amplitude-modulating said signal to be modulated, based on said amplitude detection signal, to output an amplitude modulated signal; and
    synthesizing means for combining said amplitude modulated signal with said first component signal to output a synthesized signal, said first component signal being a low frequency component signal in a band below a predetermined frequency and said second component signal being a high frequency component signal in a band above said predetermined frequency;.
    wherein said signal processing means includes a zero cross generator for generating a zero cross signal having a rectangular waveform corresponding to a waveform and zero crosses of said high frequency component signal; and
    including gate means provided between said amplitude modulating means and said synthesizing means, and switched on and off by a predetermined blanking signal.

5. An equalizing circuit according to claim 4, wherein said reproduced signal is a video component signal.

6. An equalizing circuit for reproduced signals comprising:
    filter means, which divides a reproduced signal into a first component signal and a second component signal having different bands, and which outputs said first and second component signals;
    detecting means for detecting an amplitude of said second component signal to output an amplitude detection signal;
    signal processing means for subjecting said second component signal to predetermined signal processing to obtain a signal to be modulated;
    amplitude modulating means for amplitude-modulating said signal to be modulated, based on said amplitude detection signal, to output an amplitude modulated signal; and
    synthesizing means for combining said amplitude modulated signal with said first component signal to output a synthesized signal, said first component signal being a low frequency component signal in a band below a predetermined frequency and said second component signal being a high frequency component signal in a band above said predetermined frequency;

wherein said signal processing means includes a zero cross generator for generating a zero cross signal having a rectangular waveform corresponding to a waveform and zero crosses of said high frequency component signal; and wherein said synthesizing means includes a first adder, a second adder, and gate means which has an input coupled to an output of said first adder and which is switched on and off by a predetermined blanking signal, each said signal to be modulated being applied to a respective input of said first adder, and an output of said gate means and said first component signal being applied to respective inputs of said second adder, said second adder outputting said synthesized signal.

7. An equalizing circuit according to claim 6, wherein said reproduced signal is a video component signal.

* * * * *